(12) United States Patent
Sanders et al.

(10) Patent No.: US 9,422,445 B2
(45) Date of Patent: *Aug. 23, 2016

(54) SULFONAMIDE-CONTAINING TOPCOAT AND PHOTORESIST ADDITIVE COMPOSITIONS AND METHODS OF USE

(71) Applicants: International Business Machines Corporation, Armonk, NY (US); Central Glass Co., Ltd., Ubeshi (JP)

(72) Inventors: Daniel Paul Sanders, San Jose, CA (US); Masaki Fujiwara, Cupertino, CA (US); Yoshiharu Terui, San Jose, CA (US)

(73) Assignees: International Business Machines Corporation, Armonk, NY (US); Central Class Co., Ltd., Ubeshi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/933,851

(22) Filed: Nov. 5, 2015

(65) Prior Publication Data

US 2016/0053129 A1    Feb. 25, 2016

Related U.S. Application Data

(63) Continuation of application No. 12/709,277, filed on Feb. 19, 2010, now Pat. No. 9,223,217.

(51) Int. Cl.
| | |
|---|---|
| *G03F 7/004* | (2006.01) |
| *C09D 133/16* | (2006.01) |
| *G03F 7/039* | (2006.01) |
| *G03F 7/11* | (2006.01) |
| *G03F 7/20* | (2006.01) |
| *G03F 7/038* | (2006.01) |

(52) U.S. Cl.
CPC ........... *C09D 133/16* (2013.01); *G03F 7/0046* (2013.01); *G03F 7/11* (2013.01); *G03F 7/2041* (2013.01); *G03F 7/0382* (2013.01); *G03F 7/0392* (2013.01); *G03F 7/0397* (2013.01)

(58) Field of Classification Search
CPC ...... G03F 7/004; G03F 7/0046; G03F 7/039; G03F 7/0392; C08F 214/18; C08F 2218/20; C08F 2218/22; C09D 133/16
USPC ............... 430/270.1, 326; 526/243, 245, 248
See application file for complete search history.

(56) References Cited

U.S. PATENT DOCUMENTS

| | | | |
|---|---|---|---|
| 3,629,332 A | 12/1971 | Harrington et al. | |
| 3,766,193 A | 10/1973 | Harrington et al. | |
| 6,165,678 A | 12/2000 | Allen et al. | |
| 6,177,228 B1 | 1/2001 | Allen et al. | |
| 6,399,277 B1 | 6/2002 | Nojima et al. | |
| 6,949,325 B2 | 9/2005 | Li et al. | |
| 7,063,931 B2 | 6/2006 | Li et al. | |
| 7,115,771 B2 | 10/2006 | Komata et al. | |
| 7,335,456 B2 | 2/2008 | Li et al. | |
| 7,550,630 B2 | 6/2009 | Matsunaga et al. | |
| 9,223,209 B2 * | 12/2015 | Sanders et al. | |
| 2003/0207139 A1 | 11/2003 | Tsutsumi et al. | |
| 2005/0003303 A1 | 1/2005 | Watanabe et al. | |
| 2005/0058930 A1 | 3/2005 | Li et al. | |
| 2005/0202351 A1 | 9/2005 | Houlihan et al. | |
| 2006/0216643 A1 | 9/2006 | Li et al. | |
| 2007/0117031 A1 | 5/2007 | Mizukawa et al. | |
| 2007/0178405 A1 * | 8/2007 | Kanda et al. | 430/270.1 |
| 2007/0254235 A1 | 11/2007 | Allen et al. | |
| 2008/0038661 A1 | 2/2008 | Chiba et al. | |
| 2008/0038676 A1 | 2/2008 | Li et al. | |
| 2008/0182906 A1 | 7/2008 | Lardy et al. | |

(Continued)

FOREIGN PATENT DOCUMENTS

| | | |
|---|---|---|
| CN | 1637603 A | 7/2005 |
| CN | 1846169 A | 10/2006 |

(Continued)

OTHER PUBLICATIONS

Li et al, "High Performance 193nm Photoresists Based on Fluorosulfonamide" Proc. of SPIE 6519: 65190F (2007).

(Continued)

*Primary Examiner* — Anca Eoff

(74) *Attorney, Agent, or Firm* — Karen Canaan; CanaanLaw, P.C.

(57) ABSTRACT

Provided are sulfonamide-containing compositions, topcoat polymers, and additive polymers for use in lithographic processes that have improved static receding water contact angles over those known in the art. The sulfonamide-containing topcoat polymers and additive polymers of the present invention include sulfonamide-substituted repeat units with branched linking group as shown in Formula (I):

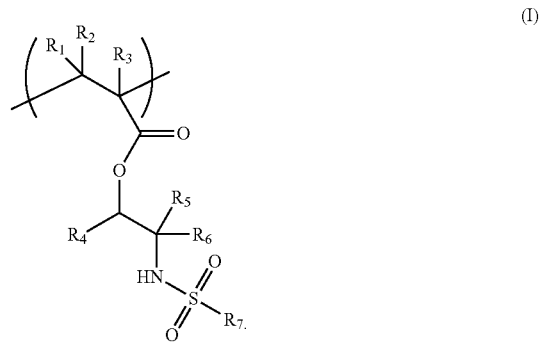

18 Claims, 7 Drawing Sheets

(56) References Cited

U.S. PATENT DOCUMENTS

| | | | |
|---|---|---|---|
| 2008/0187860 A1 | 8/2008 | Tsubaki et al. | |
| 2008/0207721 A1 | 8/2008 | Berger et al. | |
| 2009/0023903 A1 | 1/2009 | Connolly et al. | |
| 2009/0069595 A1 | 3/2009 | Komata et al. | |
| 2009/0227667 A1 | 9/2009 | Kreft et al. | |
| 2010/0003615 A1 | 1/2010 | Nakamura et al. | |
| 2010/0173245 A1* | 7/2010 | Wang et al. | 430/270.1 |
| 2011/0111342 A1 | 5/2011 | Ichikawa et al. | |
| 2011/0207052 A1 | 8/2011 | Sanders et al. | |

FOREIGN PATENT DOCUMENTS

| | | |
|---|---|---|
| CN | 1930524 A | 3/2007 |
| EP | 1950610 A1 | 7/2008 |
| JP | 2005023304 A | 1/2005 |
| JP | 2005196209 A | 7/2005 |
| JP | 2007191566 A | 8/2007 |
| JP | 2007525696 A | 9/2007 |
| JP | 2007316448 A | 12/2007 |
| JP | 2009237379 A | 10/2009 |
| JP | 2011121938 A | 6/2011 |
| JP | 2011123480 A | 6/2011 |
| JP | 2011252145 A | 12/2011 |
| JP | 2011253179 A | 12/2011 |
| JP | 2012012572 A | 1/2012 |
| JP | 2012144734 A | 8/2012 |
| JP | 2013519923 A | 5/2013 |
| KR | 20080056321 A | 6/2008 |
| TW | 2011126266 A | 8/2011 |
| TW | 1418942 B | 12/2013 |
| WO | 2007049637 A1 | 5/2007 |

OTHER PUBLICATIONS

Sunberg et al, "Contact Angles & Structure/Surface Property Relationships of Immersion Materials," Proc. of SPIE 6519: 65191Q (2007).

Varanasi et al, "Exploring Acidic Functionalities in the Design and Development of High Performance 193nm Photoresist Polymers," Journal of Photopolymer Science and Technology, vol. 20, No. 4, pp. 481-491 (2007).

Yadav et al., Indium Triflate-Catalyzed Ring Opening of Aziridines with Carboxylic Acids, Tetrahedron Letters 43: 2099-2101 (2001).

International Search Report and Written Opinion for PCT/EP2011/051564 mailed from the ISA on Dec. 30, 2011.

UK Examination Report for GB1207369.8 dated Mar. 31, 2015.

* cited by examiner

| Material | Poly(EATf-MA) | Poly(1,4-CHTf-MA) | Poly(AMNB-Tf-MA) | Poly(NBHFAMA) | Poly(MA-BTHB-OH) |
|---|---|---|---|---|---|
| SRCA | 47° | 48° | 56° | 65° | 70° |
| TMAH dissolution rate | 3000 nm/s | 220 nm/s | 150 nm/s | 0.4 nm/s | 145 nm/s |
| $T_g$ | 73 °C | 180 °C | 148 °C | 159 °C | 104 °C |

FIG. 1

SULFONAMIDE-CONTAINING TOPCOAT AND PHOTORESIST ADDITIVE COMPOSITIONS AND METHODS OF USE

CROSS-REFERENCE TO RELATED APPLICATIONS

This application is a continuation of U.S. patent application Ser. No. 12/709,277, filed on Feb. 19, 2010, which is incorporated by reference in its entirety herein.

TECHNICAL FIELD

The invention relates generally to polymeric compositions comprising repeat units comprising a sulfonamide group and a branched linking group. The invention more specifically relates to sulfonamide-containing topcoat and photoresist additive compositions with improved static receding water contact angles over those known in the art.

BACKGROUND OF THE INVENTION 193 nm water-immersion lithography is currently the state-of-the-art optical lithography used in high volume manufacturing of semiconductors. It will remain so via the additional incorporation of computational lithography and double patterning/double exposure techniques until a next generation lithography technique (such as extreme ultraviolet (EUV) lithography) is available. The imposition of water between the lens and the photoresist in immersion lithography places stringent demands on the resist material. In particular, photoresist components (especially photoacid generators) must be prevented from leaching into the immersion fluid, which would increase defectivity. Scanner manufacturers have established specifications for the maximum rates of PAG leaching in order to protect the lens of the immersion scanner from contamination. In addition, the photoresist surface is required to have high water contact angles in order to contain the water beneath the immersion showerhead of the immersion lithography tool during rapid wafer scanning Beyond a critical velocity, meniscus forces can no longer contain the water at the receding contact line and a trail of residual water is left behind on the wafer (referred to as film pulling). Subsequent evaporation of this residual water has been positively correlated with increasing defects in the printed patterns. Several mechanisms involved in the formation of defects include concentration of extracted materials in the immersion fluid and subsequent deposition on the wafer during drying, localized swelling, and inter-diffusion between the topcoat and photoresist at the spot of droplet evaporation. Collectively, these printed defects are sometimes referred to as watermarks. In addition, the heat of evaporation of the water results in wafer cooling and causes thermal shrinkage of the photoresist layer and overlay problems.

Shedd et al. (*Proc. SPIE* 6154:61540R (2006)) have shown a correlation between the critical velocity for fluid loss and the static, receding water contact angle (SRCA) of the surface (i.e., hydrophobic surfaces with higher static receding water contact angles allow for faster wafer scanning without film pulling). For more hydrophilic surfaces, the critical velocity is limited by film pulling while for more hydrophobic surfaces the critical velocity is limited by inertial instability.

For standard wafer scan rates of about 500 mm/s, topcoat or photoresist materials should have a static receding water contact angle greater than about 55° to avoid film pulling, with even higher receding water contact angles being advantageous. The required receding water contact angle to avoid film pulling will understandably vary according to the showerhead and fluid management strategy employed by the immersion tool manufacturers and the wafer scan rate, with higher scan rates requiring higher receding water contact angles. Additionally, the values vary slightly depending upon the specific technique employed to measure the water contact angles. Accordingly, these values should be considered only to be general guides; however, the higher the SCRA value of the immersion surface, the faster wafers can be scanned without increasing defectivity. Therefore, immersion surfaces with higher SCRA values will help improve tool throughput and maintain yield by insuring no additional defectivity results from the increased wafer scan rate. Since it is important to optimize both of these parameters for various lithographic processes to be cost effective, it is beneficial to use patterning materials (e.g., topcoats and topcoat-free resists) with high SCRA values.

Additionally, the extremely high advancing water contact angles of early immersion topcoats led to the formation of a class of defects related to micro-bubbles when imaged on early immersion lithography tools. When the advancing water contact angle was too high (greater than about 95°), micro-bubbles of gas could be entrapped in the advancing meniscus at high scan rates; these micro-bubbles acted like micro-lenses and led to circular defects. As such, it was desired that topcoats and photoresists used without topcoats in immersion lithography should have advancing water contact angles less than about 95° to avoid these issues on such tools. Again, the precise advancing water contact angle region in which this bubble defect mechanism occurs differs according to the showerhead design and fluid management strategy applied by different immersion scanner manufacturers. Improvements in showerhead design and scanner tooling have since largely eliminated this type of patterning defect. Therefore, the static advancing water contact angle may no longer be a critical parameter with respect to topcoat performance and defectivity when state-of-the-art immersion tools are employed. However, it is beneficial for materials for immersion lithography to have low contact angle hysteresis (i.e., the difference between the advancing and receding water contact angles should be low).

Conventional photoresists designed for dry 193 nm lithography suffer from low SRCA values (~50-55° C.) and unacceptable PAG leaching rates. Several materials approaches have been used to make photoresists compatible with immersion lithography and, specifically, to address the PAG leaching and water contact angle issues. The first, and most widely used, method involves coating a protective topcoat material on top of the photoresist to prevent resist component leaching and control water contact angles.

Early topcoats such as TSP-3A from Tokyo Ohka Kogyo (Tokyo, Japan) were based on hydrophobic fluoropolymers. Although these materials possess very large receding contact angles (>100°) with water and enable good lithographic performance, these fluoropolymer topcoats are not soluble in standard aqueous tetramethylammonium hydroxide photoresist developer and, therefore, require an extra topcoat removal step using a fluorinated solvent prior to resist development. These extra process steps and materials increase the cost-of-ownership of this type of topcoat. For at least these reasons, these topcoats are no longer commercially available.

Alkali-soluble topcoats are preferred because they can be removed during the photoresist development step; however, the number of hydrophilic functional groups necessary to impart base-solubility typically limits the SRCAs of these materials to between 55 and 65 degrees. Most acidic groups like carboxylic acid or base-reactive groups like anhydrides are too hydrophilic to impart high SRCA values and low contact angle hysteresis (i.e., the difference between the static advancing and static receding contact angles). For specific examples, see Sundberg et al., *Proc. SPIE* 6519: 65191Q (2007). Fluorine-containing groups such as 1,1,1,3,3,3-hexafluoro-2-hydroxy-propan-2-yl groups (so called hexafluoroalcohol (HFA) or fluoroalcohol) have a sufficiently low $pK_a$ that they can dissolve in TMAH developer, yet are relatively hydrophobic and have less detrimental effects on receding contact angles than other alternatives. Due to these advantageous properties, many commercial topcoat materials utilize HFA groups as a relatively non-polar acidic group to impart base solubility. In particular, HFA-functional acrylic polymers based on 1,1,1-trifluoro-2-(trifluoromethyl)-2-hydroxy-pentan-4-yl methacrylate (MA-BTHB-OH) have found widespread use in topcoat materials due to its combination of moderate TMAH dissolution rate and high SRCA (see, Sanders et al., *Proc. SPIE* 6519:651904 (2007). Copolymerization of MA-BTHB-OH with non-alkali soluble monomers with higher fluorine content can afford copolymers with higher water contact angles; however, only limited quantities of alkali-insoluble comonomers can be incorporated (ca. ~20%) without rendering the copolymer insoluble in TMAH developer. In addition, it is common to add comonomers (such as those bearing strongly acidic groups) to tune the interaction between the topcoat and the underlying photoresist and, thereby, eliminate any potential profile issues in the final resist pattern (e.g., eliminate T-topping or bridging defects); however, these same comonomers tend to have a detrimental impact on SRCA values. In practice, topcoat materials based on HFA-containing polymers with sufficient dissolution rate (>100 nm/s) in TMAH developer have been unable to progress beyond SRCA values of about 65-70 degrees.

Alternatively, topcoat materials based on sulfonamide-functionalized polymers have been developed. In particular, trifluoromethanesulfonamide groups have been used due to their appropriate $pK_a$, transparency, and hydrophobicity. These materials exhibit higher base dissolution rates but typically much lower SRCA values (see, e.g., poly(MA-BTHB-OH) vs. poly(EATf-MA) in FIG. 1). In addition, the EATf-MA material has a low Tg (~73° C.) as well, further limiting its utility. The incorporation of cyclic or polycyclic linking groups (see, e.g., Poly(1,4-CHTf-MA) and poly (AMNB-Tf-MA)) has been shown to increase the glass transition temperature and etch resistance but significantly reduces the alkali dissolution rates and does not increase the SRCA values to levels competitive with analogous HFA-based materials. In addition, copolymerization of these faster dissolving sulfonamide-functionalized methacrylates with more hydrophobic monomers cannot match the SRCA values of HFA-based polymers at comparable base dissolution rates.

As such, there is a great need for new materials with high alkali dissolution rates and improved static receding water contact angles for the synthesis of immersion-related patterning materials, such as topcoats. Importantly, these monomers/materials should have high transparency at 193 nm, which precludes the use of heavily absorbing aromatic moieties such as p-toluenesulfonamide groups.

In order to eliminate the additional materials, processes, and cost associated with using a topcoat, topcoat-free resists have been developed which do not require the use of a topcoat to provide good imaging performance with immersion lithography. Immersion-compatible photoresists using hydrophobic base resins are known in the art. In order to increase the SRCA of the base photoresist resin, significant quantities of hydrophobic monomers must be incorporated. This modification can significantly alter the physical, chemical, and lithographic properties of the resist. In practice, these immersion resists have limited SRCA values. The lack of any barrier layer results in high levels of PAG leaching into the immersion fluid when the resist is formulated with conventional PAGs. Therefore, these resists must be formulated with special PAGs with significantly lower water solubility, which in turn limits the freedom of chemists to tune the photoresist performance.

Alternatively, conventional photoresists have been converted to topcoat-free photoresists through the addition of surface-active polymeric additives (typically specially designed fluoropolymers). These additives segregate to the film surface during spin-coating of the photoresist to form a thin enrichment layer and thereby control resist component extraction and water contact angles. A number of types of materials have been designed for use as additives (see, Sanders et al., *Proc. SPIE* 6519:651904 (2007)). Typically, these additive are classified as topcoat-type (e.g., the additives are alkali-soluble) or resist-type (e.g., the additives have a solubility switch and, typically, become alkali-soluble in the exposed regions after the post-exposure bake due to the action of the photogenerated acid). Many of the topcoat-type additives, however, have acidic moieties such as HFA groups to ensure adequate wetting of the non-exposed regions during alkali development. For the topcoat-type additives, the performance of the HFA-based additives is limited by the relatively low alkali dissolution rates of the high SRCA, HFA-based monomers (e.g., only limited quantities of more hydrophobic comonomers to be incorporated into the polymers before they become insoluble in alkali developer). Sulfonamide-based additives have also been reported; however, these additives suffer from the same limitations discussed previously for topcoat applications. Their lower SRCA values dominate any benefit from their higher dissolution rates, and therefore, HFA-based materials have proven superior. Again, there is a great need for new materials with high alkali dissolution rates and improved static receding water contact angles for the synthesis of polymeric additives for topcoat-free immersion photoresists.

SUMMARY OF THE INVENTION

The present invention overcomes the need in the art by providing polymeric compositions, sulfonamide-containing topcoat compositions, and photoresist additive compositions comprising repeat units having a sulfonamide group and a branched linking group.

In one embodiment of the present invention, there is provided a composition, comprising a repeat unit comprising a sulfonamide group and a branched linking group.

In another embodiment, the branched sulfonamide-substituted repeat unit has a structure according to Formula (I)

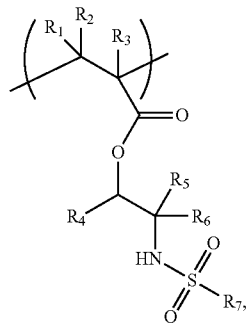
(I)

wherein R1 and R2 are independently selected from the group consisting of hydrogen, fluorine, methyl, and trifluoromethyl; R3 is selected from the group consisting of hydrogen, a halogen, C1-C12 alkyl, and fluorinated C1-C12 alkyl; R4, R5, and R6 are independently selected from hydrogen, fluorine, C1-C12 alkyl, and fluorinated C1-C12 alkyl; R7 is fluorinated C1-C12 alkyl; and at least one of R4, R5, and R6 includes carbon.

In another embodiment, R7 is selected from trifluoromethyl and perfluorobutyl.

In a further embodiment, the branched sulfonamide-substituted repeat unit is one of Formulas (II), (III), (V), and (VI).

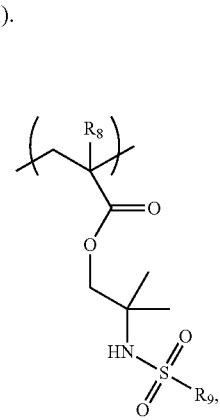
(II)

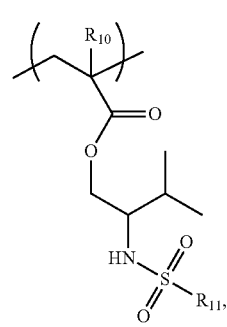
(III)

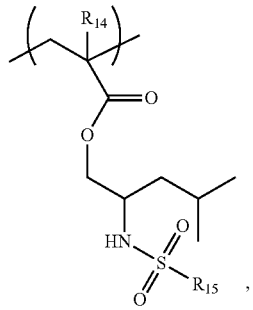
(V)

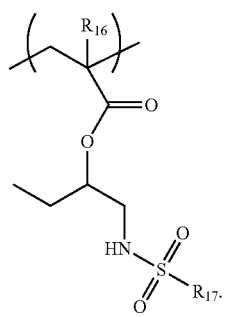
(VI)

In another embodiment, the branched sulfonamide-substituted repeat unit is selected from the group consisting of Formulas (IV) and (VII)-(IX)

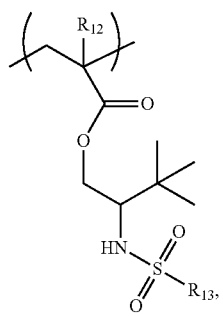
(IV)

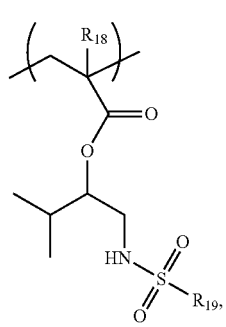
(VII)

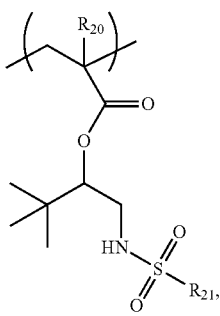

(VIII)

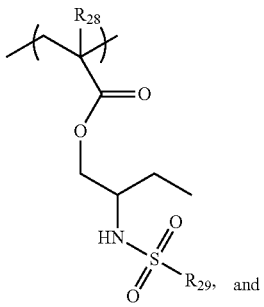

(XII)

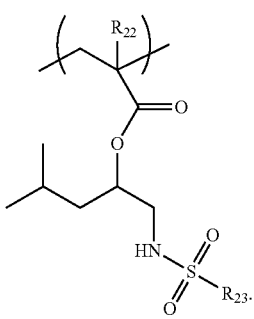

(IX)

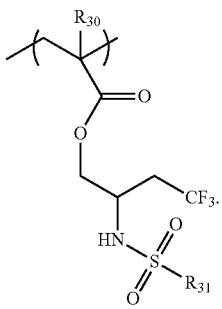

and (XIII)

In yet another embodiment, the branched sulfonamide-substituted repeat unit is selected from the group consisting of Formulas (X)-(XIII)

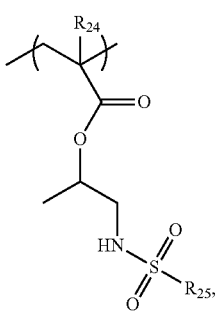

(X)

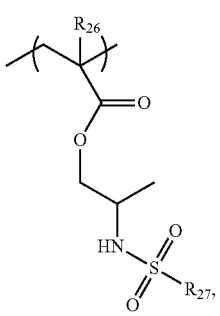

(XI)

In one embodiment of the invention, R8, R10, R12, R14, R16, R18, R20, R22, R24, R26, R28, and R30 are independently selected from the group consisting of hydrogen, fluorine, methyl, and trifluoromethyl; and R9, R11, R13, R15, R17, R19, R21, R23, R25, R27, R29, and R31 are independently fluorinated C1-C12 alkyl.

In another embodiment, R9, R11, R13, R15, R17, R19, R21, R23, R25, R27, R29, and R31 are independently selected from trifluoromethyl and perfluorobutyl.

In another embodiment of the present invention, there is provided a topcoat composition, comprising a polymer and a solvent, wherein the polymer includes a repeat unit having a sulfonamide group and a branched linking group. In a preferred embodiment, the repeat unit may constitute at least 5 mole % of this polymer.

In one embodiment, the topcoat composition further comprises another polymer that is different from said polymer.

In another embodiment, the topcoat composition further comprises an additive selected from the group consisting of surfactants, PAGs, bases, dyes, and sensitizers.

In a further embodiment of the present invention, there is provided a topcoat-free photoresist composition, comprising an additive polymer, a photoresist polymer, a PAG, and a solvent, wherein the additive polymer includes a repeat unit having a sulfonamide group and a branched linking group. In a preferred embodiment, the repeat unit may constitute at least 5 mole % of the additive polymer.

In one embodiment, the wt % of the additive polymer with respect to the photoresist polymer is between 0.01 wt % and 20 wt %.

In another embodiment, the wt % of the additive polymer with respect to the photoresist polymer is between 0.1 wt % and 5 wt %.

In a further embodiment, the topcoat-free photoresist composition further comprises an additive selected from the group consisting of surfactants, PAGs, bases, dyes, and sensitizers.

In a further embodiment of the present invention, there is provided a method of using a topcoat composition in a lithographic process comprising the steps of: (a) applying a layer of the topcoat composition of the present invention to form a topcoat on a layer of a photoresist; (b) optionally, baking the topcoat; (c) patternwise exposing the photoresist; (d) optionally, baking the exposed photoresist; and (e) developing the photoresist with a developer to selectively remove the topcoat and portions of the photoresist.

In another embodiment of the present invention, there is provided a method of patterning a topcoat-free photoresist in a lithographic process comprising the steps of: (a) applying a layer of the topcoat-free photoresist composition of the present invention on a substrate; (b) optionally, baking the topcoat-free photoresist; (c) patternwise exposing the topcoat-free photoresist; (d) optionally, baking the exposed topcoat-free photoresist; and (e) developing the topcoat-free photoresist with a developer to selectively remove portions of the topcoat-free photoresist.

In one embodiment, the photoresist is exposed using 193 nm water immersion lithography.

In another embodiment, the developer is selected from tetramethylammonium hydroxide and an organic solvent.

Additional aspects and embodiments of the invention will be provided, without limitation, in the detailed description of the invention that is set forth below.

BRIEF DESCRIPTION OF THE DRAWINGS

FIG. 1 shows a comparison of the static receding contact angle (SRCA), TMAH dissolution rate, and glass transition temperature ($T_g$) of known/comparative sulfonamide-based and hexafluoroalcohol-based methacrylate homopolymers.

DETAILED DESCRIPTION OF THE INVENTION

Set forth below is a description of what are currently believed to be preferred embodiments of the claimed invention. Any alternates or modifications in function, purpose, or structure are intended to be covered by the claims of this application. As used in this specification and the appended claims, the singular forms "a," "an," and "the" include plural referents unless the context clearly dictates otherwise. The terms "comprises" and/or "comprising," as used in this specification and the appended claims, specify the presence of stated features, steps, elements, materials, and/or groups, but do not preclude the presence or addition of one or more other features, steps, elements, materials, and/or groups thereof.

As used herein, the term "branched linking group" is used to refer to a non-linear and non-cyclic linking group that links the sulfonamide group to the methacrylate group on the polymeric compositions of the present invention. The "branched linking group" will necessarily have at least one methyl group in the branched structure. It is to be understood that the at least one methyl group may include any methyl-containing group, such as methyl, ethyl, n-propyl, isobutyl, n-butyl, isobutyl, t-butyl, octyl, decyl, tetradecyl, hexadecyl, eicosyl, tetracosyl, and the like. Alternatively, the at least one methyl group may include functionalized methyl groups, such as trifluoromethyl, trifluoroethyl, perfluoropropyl, perfluorobutyl, or any other non-cyclic fluorinated alkyl groups. With reference to Formula (I), shown supra, R4, R5, and R6 comprise the branched linking group, wherein at least one of R4, R5, and R6 includes carbon.

The term "fluorinated C1-C12 alkyl" as used herein is meant to include perfluorinated C1-C12 alkyl, such as trifluoromethyl and perfluorobutyl, without limitation.

The term "optional" or "optionally" as used herein is used to refer to a circumstance that may or may not occur. For example, in the lithographic methods described herein, the term "optionally, baking the topcoat polymer," "optionally, baking the exposed photoresist," or "optionally, baking the exposed photoresist" means that the topcoat polymer and/or the photoresist may or may not be baked within the described method.

Figure 2:
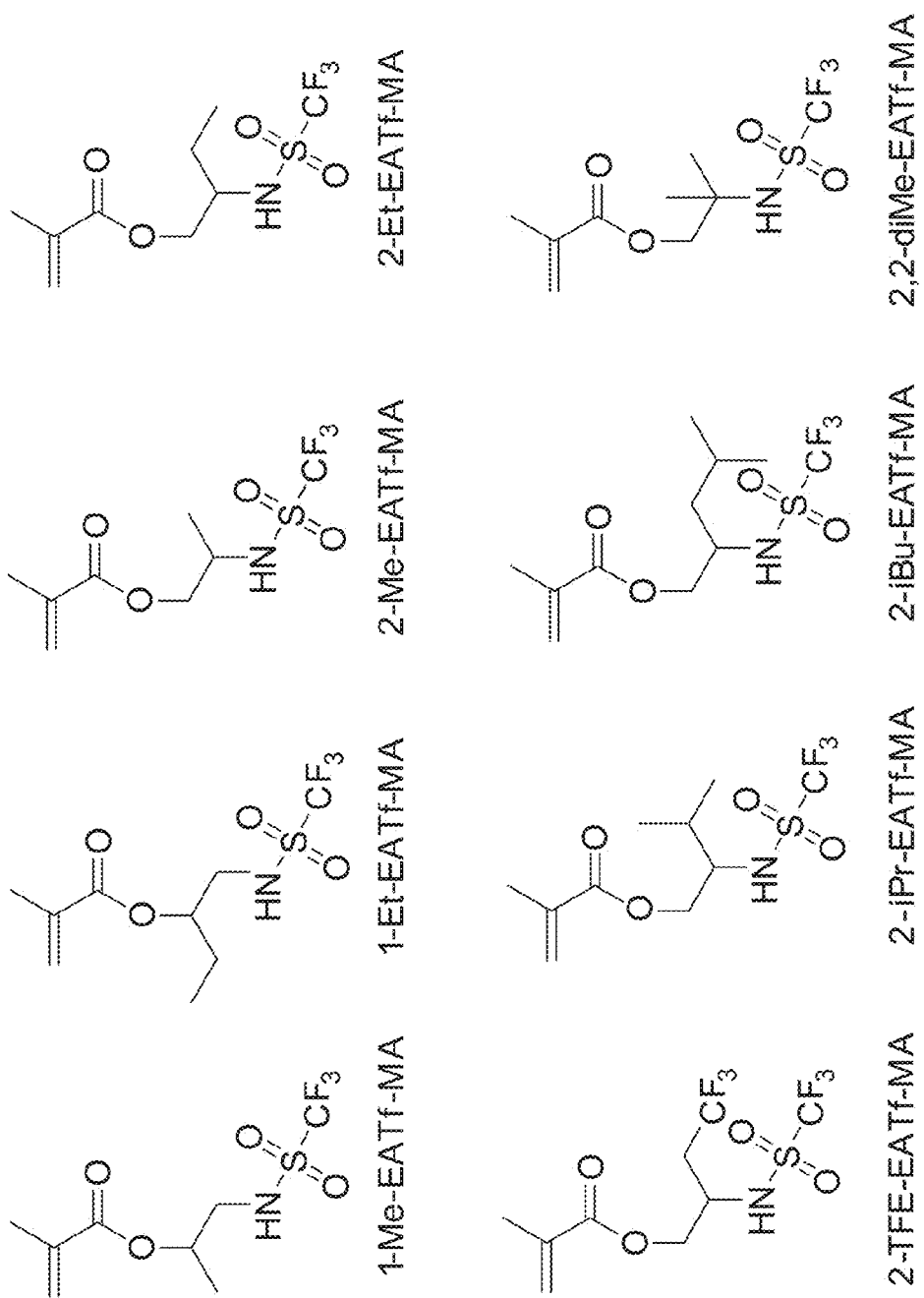
FIG. 2 shows sulfonamide-functionalized methacrylate monomers of the present invention.

A new series of sulfonamide-functionalized methacrylate materials is provided herein in which branched linking groups are used to boost the hydrophobicity while retaining a relatively high dissolution rate in alkaline developer. Exemplary sulfonamide-functionalized methacrylates of the present invention are shown in FIG. 2.

In general, the desired properties for topcoat materials for water immersion lithography comprise a high SRCA value and a high TMAH dissolution rate (see, e.g., the top right area of the graph); however, it is not possible to achieve high values for both of these properties using HFA-based materials. As a monomer structure is modified to increase the static receding contact angle, the dissolution rate of the monomer in 0.26 N TMAH developer decreases rapidly. The HFA-based material with the best combination of properties for topcoat applications is poly(MA-BTHB-OH).

Figure 3:
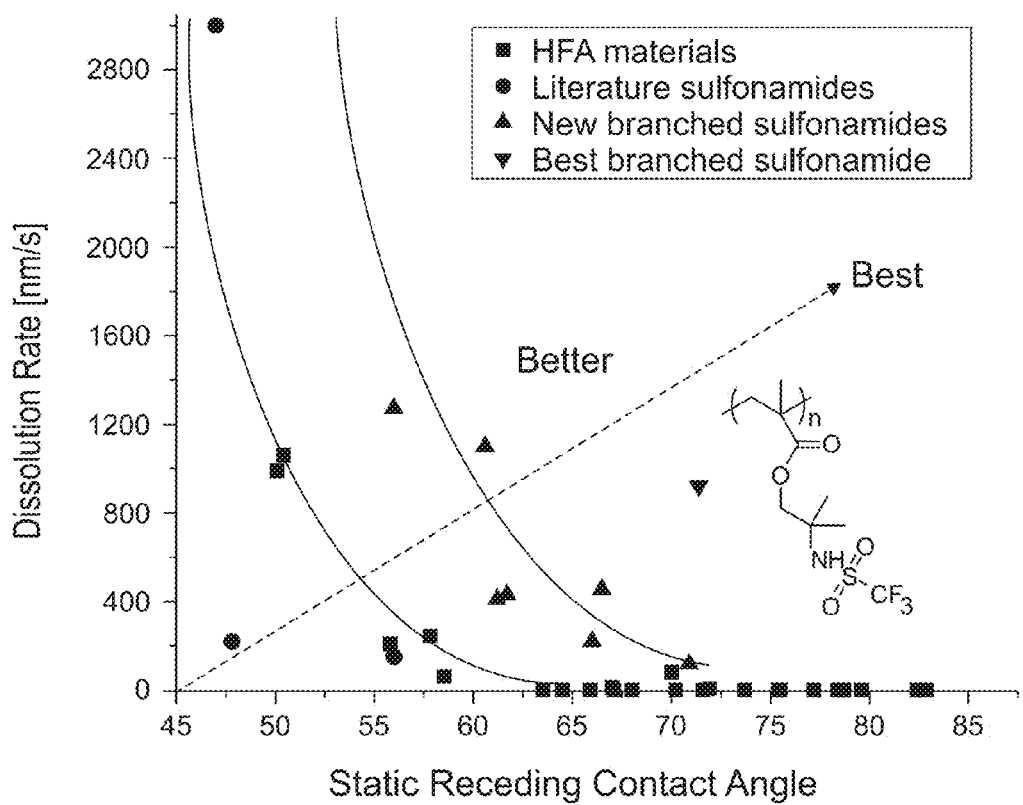
FIG. 3 is a graph of dissolution vs. SRCA for known hexafluoroalcohol- and sulfonamide-functionalized methacrylate homopolymers and for the sulfonamide-functionalized methacrylate monomers of the present invention.

FIG. 3 shows dissolution rates as a function of SRCA values of homopolymers of HFA-functionalized methacrylates known in the art (filled squares), homopolymers of sulfonamides-containing methacrylates known in the art (filled circles), and homopolymers of the sulfonamide-containing methacrylates with branched linking groups of the present invention (filled triangles). The property frontier in FIG. 3 is shown by a dashed line. The known sulfonamide-based materials have even less desirable combinations of properties than those of the HFA-based materials.

Homopolymers of sulfonamide-based methacrylates with branched linking groups (as shown in FIG. 3, filled triangles) display both superior TMAH dissolution rates and higher SRCA values than current HFA-based materials as well as known sulfonamide-based materials with linear or cyclic linking groups. It is evident that the property frontier of these materials is significantly better (e.g., shifted up and to the right) compared to that of the known materials. When compared to known sulfonamide materials bearing a linear linking group (e.g., poly(EATf-MA)), the inventive materials bearing branched linking groups advantageously display higher SRCA values and increased glass transition temperatures, while still providing acceptable alkali dissolution rates. Further, when compared to sulfonamide materials bearing cyclic or polycyclic linking groups (e.g., poly(1,4-CHTf-MA) and poly(AMNB-Tf-MA)), the inventive materials bearing branched linking groups display higher SRCA values and generally higher dissolution rates, while still possessing acceptable glass transition temperatures. Branched linking groups with substituents in the 1-position (e.g., next to the methacrylate) show slightly higher receding water contact angles than analogous materials substituted at the 2-position (e.g., next to the sulfonamide). Advantageously, when the inventive materials are substituted at the 2-position, it has been found that they are easier to synthesize and can be made from lower cost and more widely available feedstocks. In addition, the 2-position has the further advantage of being able to bear two substituent groups. By contrast, analogous materials bearing two substituents at the 1-position would be tertiary esters, which are known to be acid-sensitive. For example, with reference to FIG. 2, poly(2,2-diMe-EATf-MA) has two methyl substituent groups at the 2-position; consequently, this sulfonamide has both a higher Tg, a higher SRCA, and, unexpectedly and surprisingly, a dissolution rate in 0.26N TMAH developer that is ~6 times higher than the widely used HFA-based material, poly(MA-BTHB-OH).

As noted above, another benefit of the sulfonamide-functionalized methacrylates of the present invention is that these new monomers are based on inexpensive starting materials. The monomers are straightforward to synthesize from commercially available 1,2-amino alcohols, which are widely available and inexpensive. In addition, many artificial amino acids containing fluorinated substituents and other groups have been reported. These can be simply converted to their respective 1,2-amino alcohols via reduction of the carboxylic acid. Interestingly, the presence of fluorine in the branched linking group did not significantly raise the SRCA value (see, 2-Et-EATf-MA vs. 3-TFE-EATf-MA in Table 1). In this instance, materials based on non-fluorinated branched 1,2-aminoalcohols can provide similar performance at significantly lower cost.

Advantageously, the $pK_a$ of the sulfonamide can be adjusted by modifying the identity of the group attached to the sulfonyl functionality. Trifluoromethanesulfonamide groups are particularly useful due to their combination of transparency, acidity, and hydrophobicity. The pKa and hydrophobicity can be modified, for example, by using a sulfonamide derived from perfluorobutanesulfonic acid or perfluorooctane sulfonic acid. While longer fluorinated chains may also afford increased SRCA values, materials with C8 perfluorinated chains are under regulatory scrutiny and C4 perfluorinated chains may soon follow. Therefore, trifluoromethanesulfonamides are particularly desirable due to their combination of low pKa and relatively low cost. Sulfonamides derived from p-toluenesulfonic acid are not suitable for materials intended for 193 nm lithography due to high absorbance. Similarly, non-fluorinated sulfonamides derived from methyl sulfonic acid are less suitable for immersion materials due to their relatively higher $pK_a$ values and hydrophilicity.

Figure 4:
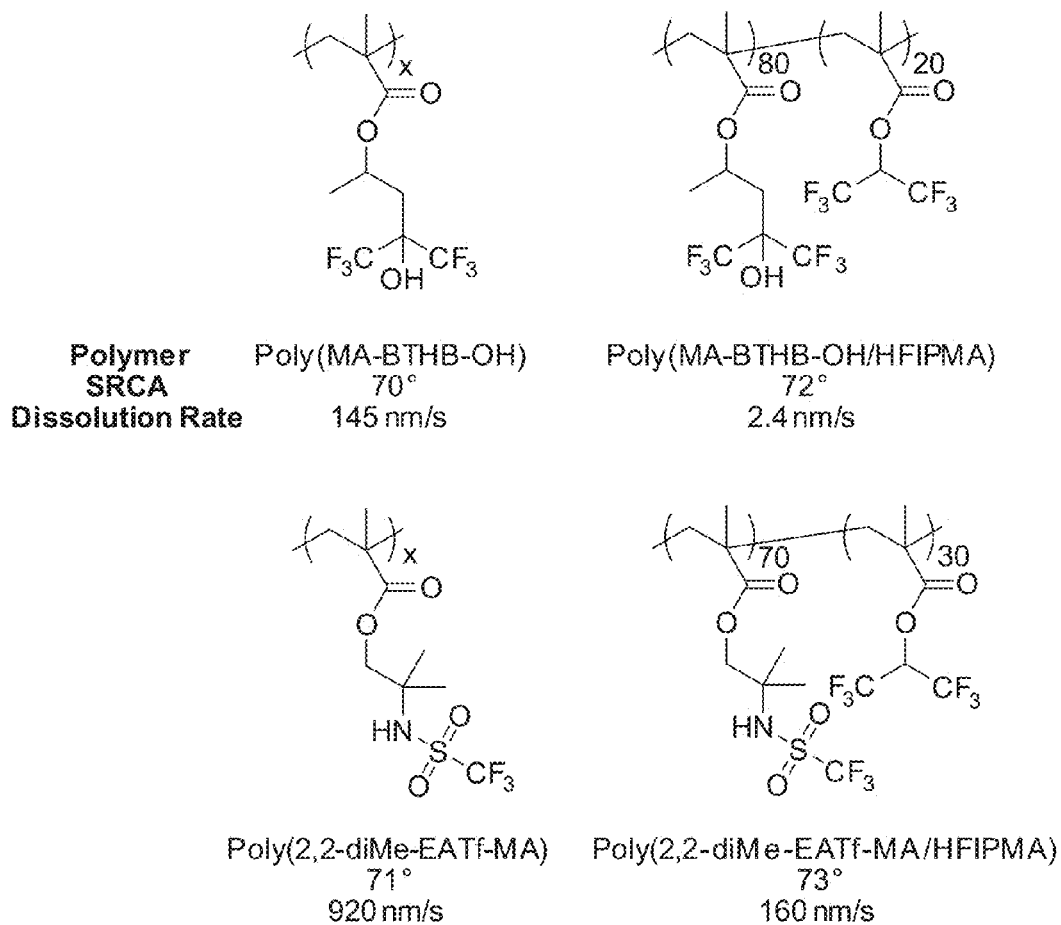
FIG. 4 show the improved SCRA and dissolution rates of polymers based on 2,2-diMe-EATF-MA.

When designing topcoat or additive materials for immersion lithography, the high TMAH dissolution rate of these new branched sulfonamide materials allows for larger quantities of non-alkali soluble, hydrophobic monomers to be incorporated via copolymerization to create immersion materials with higher SRCA values than would be possible with HFA-based materials. For example, only ~20 mol % of 1,1,1,3,3,3-trifluoroprop-2-yl methacrylate (HFIPMA) can be incorporated into a polymer of MA-BTHB-OH while retaining a non-zero dissolution rate in TMAH developer (see, FIG. 4). In comparison, the homopolymer of 2,2-diMe-EATf-MA alone has a superior SRCA value than that of poly(MA-BTHB-OH-co-HFIPMA). Even when 30 mol % HFIPMA is incorporated to boost the SRCA value, the dissolution rate in TMAH developer remains high (>150 nm/s). Thus, significantly larger quantities of hydrophobic monomers can be incorporated to increase the SRCA values or compensate for the SRCA-lowering effects of other comonomers (such as strongly acidic comonomers) used in topcoats to control photoresist profiles. In the case of surface-active additives for topcoat-free photoresists, the higher SRCA values and higher dissolution rates in TMAH devel-

TABLE 1

Properties: HFA- and Sulfonamide-Functionalized Methacrylate Homopolymers.

| Entry | Polymer | Static CA | Adv. CA | Rec. CA | Tilt Angle | Dissolution Rate in 0.26N TMAH [nm/s] | $T_g$ [° C.] |
|---|---|---|---|---|---|---|---|
| Known/Comparative Materials | | | | | | | |
| P1 | Poly(MA-BTHB-OH) | 84.6° | 86.1° | 70.0° | 14.5° | 145 | 104 |
| P2 | Poly(NBHFAMA) | 77.3° | 81.4° | 64.5° | 15.3° | 0.4 | 159 |
| P3 | Poly(EATf-MA) | 71.4° | 84.2° | 47.0° | 34.7° | 3000 | 73 |
| P4 | Poly(1,4-CHTf-MA) | 64.8° | 81.1° | 47.8° | 30.7° | 220 | 180 |
| P5 | Poly(AMNB-Tf-MA) | 69° | 76° | 56° | 18° | 150 | 148 |
| Inventive Materials | | | | | | | |
| P6 | Poly(1-Me-EATf-MA) | 72.9° | 81.3° | 60.6° | 18.1° | 1100 | 109 |
| P7 | Poly(1-Et-EATf-MA) | 78.7° | 83.3° | 66.5° | 15.1° | 455 | 101 |
| P8 | Poly(2-Me-EATf-MA) | 81.6° | 88.1° | 56.0° | 29.6° | 1270 | 82 |
| P9 | Poly(2-Et-EATf-MA) | 79.9° | 88.4° | 61.7° | 23.6° | 430 | 111 |
| P10 | Poly(2-TFE-EATf-MA) | 76.4° | 87.6° | 61.2° | 23.8° | 410 | — |
| P11 | Poly(2-iPr-EATf-MA) | 82.2° | 90.6° | 66.0° | 22.2° | 220 | 120 |
| P12 | Poly(2-iBu-EATf-MA) | 87.7° | 94.0° | 70.9° | 20.1° | 118 | 114 |
| P13/TC7 | Poly(2,2-diMe-EATf-MA) | 84.9° | 90.3° | 71.4° | 17.8° | 920 | 122 | oper of the new branched sulfonamides allow larger quantities these monomers be employed (relative to the sulfonamide monomers known in the art) to improve the TMAH dissolution rate (or photospeed) of the additive without catastrophically lowering the SRCA value of the additive or adversely impacting the ability of the additive to form an enriched wetting layer at the air-photoresist interface. Alternatively, lower quantities can be used relative to HFA-based materials to achieve the same developer wetting characteristics while maintaining adequate SRCA values.

In one embodiment of the invention, there is provided a composition comprising a repeat unit comprising a sulfonamide group and a branched linking group according to Formula (I). In a further embodiment, the repeat unit has a structure according to one of Formulas (II), (III), (V), and (VI) shown supra. In another embodiment, the repeat unit selected from the group consisting of Formulas (IV) and (VII)-(IX), shown supra. In still another embodiment, the repeat unit is selected from the group consisting of Formulas (X)-(XIII) shown supra. In a further embodiment, the repeat unit may constitute at least 5 mole % of the polymer composition. As will be appreciated by those of skill in the art, the mole % of the repeat unit will depend upon the type of comonomers (if any) that are used to prepare the compositions of the present invention (see Examples 16-31).

In another embodiment of the invention, there is provided a topcoat composition comprising a polymer and a solvent, wherein the polymer includes a repeat unit having a sulfonamide group and a branched linking group. In another embodiment, the repeat unit has a structure selected from the group consisting of Formulas (I)-(XIII) shown supra. In a further embodiment, the repeat unit may constitute at least 5 mole % of the polymer. The repeat unit may constitute from 5 to 100 mole % of the polymer, more particularly 30-90 mole % of the polymer, and most particularly 50-80 mole % of the polymer.

If necessary or desirable, the topcoat composition may include, besides the casting solvent and the inventive topcoat polymer, other topcoat polymers and/or additives, such as dyes, sensitizers, additives used as stabilizers, photoacid generators, dissolution modifying agents or dissolution inhibitors, and acid-diffusion controlling agents, basic compounds, photodestructible bases (PDBs), acid amplifiers (AAs), coating aids such as surfactants or anti-foaming agents, crosslinking agents, photospeed control agents, adhesion promoters and plasticizers.

The topcoat polymer can further comprise repeat units derived from comonomers in order to tune various properties of the topcoat. For example, hydrophobic comonomers may be incorporated to increase water contact angle values. Suitable hydrophobic comonomers include methacrylate, α-(trifluoromethyl)acrylate, α-(fluoro)acrylate, and acrylate monomers bearing alkyl, fluoroalkyl, and perfluoroalkyl substituents. A few examples include: 1,1,1,3,3,3-hexafluoroprop-2-yl methacrylate, 2,2,2-trifluoroethyl methacrylate, 4,4,4,3,3,2,2-heptafluorobutyl methacrylate. Alternative comonomers include cyclic olefin (e.g., norbornene-based) monomers which may comprise hydrophobic groups such as alkyl, fluoroalkyl, and perfluoroalkyl substituents.

Comonomers comprising base-soluble groups may also be incorporated to further boost dissolution rates in alkaline developing solutions. Suitable base-soluble groups include carboxylic acid and fluoroalcohol (especially hexafluoroalcohol) groups. Representative carboxylic acid-containing monomers include acrylic acid, methacrylic acid, α-(trifluoromethyl)acrylic acid, α-(fluoro)acrylic acid, maleic acid, fumaric acid, norborn-5-ene-2-carboxylic acid, norborn-5-ene-2-methyl-2-carboxylic acid, norborn-5-ene-2-fluoro-2-carboxylic acid, norborn-5-ene-2-trifluoromethyl-2-carboxylic acid and the like.

Representative hexafluoroalcohol-containing monomers include 5/6-(3,3,3-trifluoro-2-hydroxy-2-(trifluoromethyl)propyl)bicyclo[2.2.1]heptan-2-ylmethacrylate (NB-HFAMA), 1-cyclohexyl-4,4,4-trifluoro-3-hydroxy-3-(trifluoromethyl)butan-1-yl methacrylate (MA-ACH-HFA), and 3,5-bis (1,1,1,3,3,3-hexafluoropropan-2-ol-2-yl)cyclohexyl methacrylate, and 1,1,1-trifluoro-2-trifluoromethyl-2-hydroxy-pent-4-ene, 2-(1,1,1-trifluoro-2-trifluoromethyl-2-hydroxy-prop-3-yl)norborn-5-ene (NBHFA), and 1,1,1-trifluoro-2-trifluoromethyl-2-hydroxy-pentan-4-ylmethacrylate (MA-BTHB-OH). Other suitable hexafluoroalcohol-containing monomers are reported in H. Ito, "Chemical Amplification Resists for Microlithography," Adv. Polym. Sci., 172:37 (2005) and Sanders et al. Proc. SPIE 6519:651904 (2007).

Alternatively, base-reactive groups such as lactones and carboxylic acid anhydrides may be used instead. Representative monomers bearing carboxylic acid anhydrides include maleic anhydride, norborn-5-ene-2,3-carboxylic acid anhydride. Representative monomers bearing lactone groups include a-methylene-γ-butyrolactone, 2-oxo-tetrahydrofuran-3-yl acrylate, 2-oxo-tetrahydrofuran-3-ylmethacrylate, 5-oxo-tetrahydrofuran-3-yl acrylate, 5-oxo-tetrahydrofuran-3-ylmethacrylate, hexahydro-2-oxo-3,5-methano-2H-cyclopenta[b]furan-6-yl methacrylate (NLM) and the like.

Comonomers bearing strongly acidic groups may be incorporated to tune the topcoat interaction with the photoresist and control the profiles of the imaged photoresist structures. In particular, monomers bearing sulfonic acid groups have been demonstrated to be suitable for this purpose. Representative monomers bearing sulfonic acid groups include vinyl sulfonic acid, allyl sulfonic acid, 2-sulfoethyl methacrylate, 2-sulfoethyl acrylate, 3-sulfopropyl methacrylate, 3-sulfopropyl acrylate, 2-acrylamido-2-methyl-1-propanesulfonic acid, 2-methacrylamido-2-methyl-1-propanesulfonic acid, and 4-vinyl-benzenesulfonic acid.

Monomers bearing photoacid generators may be incorporated into the topcoat in lieu of monomers bearing strongly acidic groups. In the areas exposed to the ultraviolet radiation, the polymer-bound PAG will be photochemically converted into, for example, a polymer-bound sulfonic acid. Suitable monomers bearing PAG substituents are known in the literature.

The solvent may comprise one solvent or two or more different volatile solvents. Preferred solvents which do not dissolve the underlying resist include low aliphatic alcohols, aliphatic or aromatic ethers, perfluoroalkyl ethers, fluoroalkyl ethers, saturated hydrocarbons, hydrofluorocarbons, perfluorocarbons and mixtures thereof. Example casting solvents include 2-butanol, 4-methyl-2-pentanol, di-n-butyl ether, and mixtures of 2-octanol and n-decane. Many other examples of suitable solvents are known in the art. Casting solvents are not included in total solids calculations. Further, stabilizers, surfactants and other additives (if any) may be added to the casting solution. In one example, surfactants comprise less than about 1 percent by weight of the totals solids content of the casting solution. In one example, stabilizers and other additives together comprise less than about 10 percent by weight of the total solids content of the casting solution. Surfactants, stabilizers and other additives may be added to the basic casting solution as solids or as solutions of dissolved solids to form the completed casting solution.

In one embodiment of the invention, there is provided a method of patterning a photoresist comprising the use of the topcoat composition of the present invention. In another embodiment, the method of patterning the photoresist uses 193 nm water immersion lithography. In one embodiment, the topcoat composition comprises a polymer having a repeat unit with a sulfonamide group and a branched linking group. In a further embodiment, the topcoat composition comprises a polymer having a repeat unit with a trifluoromethanesulfonamide group and a branched linking group The method of using the topcoat composition of the present invention to pattern the photoresist comprises the steps of:
(a) applying a layer of the inventive topcoat composition to form a topcoat on a layer of photoresist material;
(b) optionally, baking the topcoat;
(c) patternwise exposing the photoresist;
(d) optionally, baking the exposed photoresist; and
(e) developing the photoresist to selectively remove the topcoat and portions of the photoresist.

The topcoat is typically applied on top of a photoresist by spin coating; however, spray coating, dip coating, doctor blading, roll coating, and the like may also be used. The film thickness of the underlying photoresist may range from 1 nm to 5000 nm. Typical photoresist thicknesses used in 193 nm water immersion lithography range from 40 to 150 nm. Thinner photoresist thicknesses may be preferred for EUV or e-beam lithography and thicker layers may be preferred for 248 nm, 365 nm, or 436 nm lithography.

After application of the topcoat, the substrate may be optionally baked at an elevated temperature to remove residual casting solvent and densify the topcoat film. Typically, the post-application bake temperature is lower than the glass transition temperature of the underlying photoresist film to minimize interdiffusion of the two material layers. Typical post-application bake temperatures range from 60° C. to 150° C., more typically from 70° C. to 120° C., and even more typically from 80° C. to 100° C. Post-application bakes may last from 1 second to 10 minutes or more, although typical post-application bakes last for 30 to 90 seconds.

The film thickness of the topcoat may range from 1 nm to 5000 nm. Typical topcoat thicknesses used in 193 nm water immersion lithography range from 30 to 120 nm. The film thickness of the topcoat can be adjusted to provide for good anti-reflective properties and good leaching resistance. Top anti-reflective coating (TARC) materials have been used in dry lithography to minimize reflectivity and maximize lithographic performance. The ideal refractive index of a non-absorbing TARC is given by $$n_{TARC} = \sqrt{n_{immersionfluid} n_{resist}}$$

wherein $n_{TARC}$, $n_{imersionfluid}$, and $n_{resist}$ are the refractive indices of the TARC, immersion fluid and photoresist, respectively. Furthermore, the ideal thickness (T) corresponds to a quarter wavelength $$T_{TARC} = \frac{\lambda_0}{4 n_{TARC}}$$

wherein $\lambda_0$ is the vacuum wavelength of the radiation. More general methods to calculate the ideal optical properties and thicknesses of absorbing TARC materials are known in the literature.

The photoresist may be exposed using ultraviolet radiation (e.g., i-line or g-line), deep ultraviolet radiation (e.g., wavelength <260 nm), extreme ultraviolet radiation, or electron beam radiation. Particularly useful wavelengths include 436 nm, 365 nm, 254 nm, 248 nm, 193 nm, 157 nm, and 13.5 nm. In an embodiment, the photoresist may be exposed using 193 nm immersion lithography. In a further embodiment, the photoresist may be exposed using 193 nm water immersion lithography. Water is a particularly suitable immersion fluid due to it high transparency, good refractive index, good surface tension to viscosity ratio, good thermal properties, low cost, low toxicity, and ready availability in high purity.

Alternative immersion fluids include aqueous solutions of acids, ionic species including inorganic salts and ammonium salts), water-soluble organic compounds, surfactants, micelles, and nanoparticles. Further immersion fluids include hydrocarbon liquids. Hydrocarbon immersion fluids may comprise linear, branched, cyclic, and polycyclic saturated alkanes. Amongst these, saturated polycyclic alkanes of 8 to 12 carbons have particularly advantageous combinations of high refractive index and adequate transparency at 193 nm. Examples of hydrocarbon immersion fluids include octahydroindene, 1,1-bicyclohexyl, cis-decahydronaphthalene, trans-decahydronaphthalene, cis/trans-decahydronaphthalene, and exo-tetrahydrodicyclopentadiene. Water- and hydrocarbon-based immersion fluids may also further comprise nanoparticles. Examples of suitable nanoparticle materials include hafnium oxide, lutetium aluminum garnet, magnesium oxide, alumina, silicon dioxide. The nanoparticles may also comprise ligands or surface grafted surfactants which will stabilize the nanoparticle dispersions and prevent aggregation.

After exposure, the photoresist may optionally be subjected to a post exposure bake (PEB) to drive the chemical reaction. PEB temperatures may range from 50 to 150° C., more particularly between 60 to 140° C., and even more particularly between 70 to 130° C. Post-exposure bake processes may last from 1 second to 10 minutes, more preferably from 2 seconds to 2 minutes, and even more preferably from 10 seconds to 1 minute.

The topcoat may be removed prior to or during the development of the underlying photoresist. In one embodiment, the topcoat is removed during the photoresist development process using standard alkaline photoresist developer (usually 0.26 N aqueous tetramethylammonium hydroxide). Alternatively, the topcoat may be removed with an organic solvent prior to development of the underlying photoresist. Suitable solvents for this purpose include topcoat casting solvents listed previously. Furthermore, the topcoat may be removed during development of the underlying photoresist using an organic solvent. In such a process, the organic solvent should be selected so that it will selectively remove either the exposed or non-exposed photoresist material. If the exposed regions of the photoresist are to be removed, suitable example organic solvents include ethylene glycol, propylene glycol, isopropanol, and mixtures thereof. If a crosslinking negative-tone photoresist is used, a large variety of organic solvents may be used to selectively remove the non-exposed photoresist material as long as swelling of the crosslinked photoresist material remains within acceptable limits. If the photoresist operates via a polarity change mechanism rather than via a crosslinking mechanism, a selective organic solvent must be used to dissolve only the non-exposed regions. Suitable organic solvents for this purpose include anisole.

The resultant photoresist pattern may be used directly or further manipulated. Additional manipulations include various lithographic, surface modification, trim, and deposition processes, especially those required for double patterning lithographic processes. The photoresist pattern may be used to protect the substrate during ion implantation. In particular, the photoresist pattern may ultimately be transferred to the underlying substrate. Pattern transfer may be accomplished by either dry or wet etch processes. In particular, a reactive ion etch (RIE) using oxygen or a fluorine-containing gas may be used to transfer the pattern depending upon the chemistry of the substrate. If the substrate comprises a bottom anti-reflective coating (BARC) layer, a breakthrough etch process may be required prior to transfer of the pattern into the underlying substrate. If a photoimageable or developable BARC is used, such a process may not be required. If the pattern is transferred into a dielectric material such as an oxide layer, the resulting features may be lined and then filled with a conductive metal such as aluminum, copper, or tungsten to form metal wires, interconnects, and contacts.

In another embodiment of the invention, there is provided a topcoat-free photoresist composition comprising an additive polymer, a photoresist, a PAG, and a solvent, wherein the additive polymer includes a repeat unit having a sulfonamide group and a branched linking group. In another embodiment, the repeat unit has a structure selected from the group consisting of Formulas (I)-(XIII) shown supra. In a further embodiment, the repeat unit may constitute at least 5 mole % of the additive polymer. The repeat may constitute from 5 to 100 mole % of the additive polymer, more particularly 10-70 mole % of the additive polymer, and most particularly 15-50 mole % of the additive polymer.

Topcoat-free photoresist formulations typically comprise a photoresist base polymer or oligomer, an additive polymer, a photoacid generator, a base, and a casting solvent. After application of the photoresist formulation with the additive polymer to form a photoresist layer, the additive polymer segregates to the surface of the photoresist layer and acts as an in-situ topcoat. The additive polymer leads to high water contact angles but maintains good lithographic performance and reduces the leaching of photoresist components (e.g., photoacid generators or PAGs) into the immersion fluid.

The additive polymers of the present invention have the following properties: (1) are soluble in the photoresist formulation; (2) have a high surface activity; (3) do not degrade the dissolution properties of the photoresist (e.g., the development process) significantly after exposure and bake; (4) have the ability to block or reduce photoresist component leaching; (5) exhibit a receding water contact angle of greater than about 70° C. and preferably greater than about 75° C.; (6) exhibit advancing water contact angle of less than about 96° C.; and (7) are hydrophobic in acidic aqueous solutions and hydrophilic in basic aqueous solutions.

The additive polymers of the present invention are either soluble in aqueous base developer (topcoat-type) or become soluble after exposure (resist type). Beyond the branched sulfonamide structures, the topcoat-type additives may comprised of any of the comonomers described previously for use in topcoats. In addition, resist-type additives typically comprise a monomer which has a base-soluble group which is protected by an acid-labile group. In particular, carboxylic acid groups protected as tertiary esters or acetals/ketals undergo acidolysis or acid-catalyzed hydrolysis, respectively, to generate free carboxylic acid groups in the exposed regions of the photoresist. Acrylic or cyclic olefin monomers bearing such groups are particularly useful. Suitable tertiary ester protecting groups include t-butyl, 1-methyladamantyl, 1-ethyladamantyl, 1-methylcyclopentyl, 1-ethylcyclopentyl, 1-methylcyclohexyl, 1-ethylcyclohexyl, 1-ethylcyclooctyl, 1-isopropylcycloheptyl, t-amyl, and 2,3-dimethyl-but-2-yl groups. Suitable acetal/ketal groups include methoxymethyl ether, ethoxyethyl ether, tetrahydropyranyl, and angelicalactonyl groups. The tertiary ester and acetal/ketal protecting groups may further comprise fluorinated or perfluorinated substituents.

The loadings of the additive polymers in the photoresist formulation may range from 0.01 wt % to 20 wt % relative to the photoresist polymer and, more preferably may range from 0.1 wt % to 5 wt %.

The inventive compositions, topcoat polymers, and additive polymers may be synthesized by any known technique including anionic, free-radical polymerization, and controlled radical polymerization. Controlled free radical polymerization includes atom transfer radical polymerization (ATRP), nitroxide mediated polymerization (NMP), reversible addition fragmentation chain transfer (RAFT) polymerization, group transfer polymerization (GTP), catalytic chain transfer (CCT) polymerization, and other known methods. The inventive materials may be polymers or oligomers with linear, branched, hyperbranched, dendritic, cyclic, or other topologies. The inventive materials may comprise oligomers or polymers with random, alternating, gradient, and other statistical distributions of the various comonomers. In addition, inventive materials by comprise oligomers or polymers with block, multiblock, graft, or other architectures. The properties of the materials may also be tailored by controlling the molecular weight, molecular weight distribution (i.e., polydispersity), and the end groups. Molecular weights may range from 500 g/mol to 250,000 g/mol, preferably from 1000 g/mol to 100,000 g/mol, more preferably from 2000 g/mol to 50,0000 g/mol, and even more preferably from 5000 g/mol to 30000 g/mol. The polydispersity index (PDI), which is the ratio of the weight average molecular weight to the number average molecular weight of the polymer (i.e., $M_w/M_n$), may range from 1 to 10, more preferably from 1 to 2, and more preferably from 1 to 1.5. The molecular weight and molecular weight distribution of the inventive materials will impact the solubility properties (e.g., dissolution rates) as well as the surface-segregation behavior of the additive polymers in topcoat-free photoresists.

The end groups may be manipulated by the choice of initiating species. For example, selection of the appropriate azo or peroxide initiators determines some of the end groups in polymers made by free-radical polymerization. Chain transfer agents such as thiols can be added to free-radical polymerization to lower the molecular weight of the polymers and add specific end groups to the polymer chains. Alternatively, specific RAFT polymerization, ATRP, or NMP initiator molecules can be used which will add a particular end group at the beginning of each chain. In addition, polymers formed by such controlled radical polymerization techniques have an active groups at the chain end which may be substituted to install a wide range of functionalities as polymer end groups. The end groups will impact properties of the inventive materials such as the water contact angles and solubility properties (e.g., dissolution rates) as well as the surface-segregation behavior of the additive polymers in topcoat-free photoresists.

The topcoat compositions and additive polymers of the present invention may be used in combination with any desired photoresist formulation in the forming of a lithographic structure. The photoresist may be sensitive to ultraviolet radiation (e.g., i-line or g-line), deep ultraviolet radiation (e.g., wavelength <260 nm), extreme ultraviolet radiation, or electron beam radiation. In one embodiment of the invention, the photoresist formulation is a chemical amplification photoresist that is sensitive to shorter wavelength ultraviolet radiation (e.g., <260 nm wavelength) or to extreme ultraviolet radiation (EUV) or electron beam radiation. In particular, the photoresist may be sensitive to wavelengths including 254 nm, 248 nm, 193 nm, 157 nm, and 13.5 nm. Examples of suitable chemically amplified photoresists are described in H. Ito, "Chemical Amplification Resists for Microlithography," *Advances in Polymer Science* 172:37-245 (2005). Suitable photoresists include both positive- and negative-tone photoresists.

The photoresist polymer or oligomer in the photoresist formulation can represent up to about 99 percent by weight of the solids included in the formulation, and the photoacid generator can represent between about 0.1 percent by weight and about 25 percent by weight of the solids contained in the photoresist formulation.

Typical polymers and oligomers used in photoresist formulations include acrylates, methacrylates, cycloolefin polymers, cycloolefin maleic anhydride copolymers, cycloolefin vinyl ether copolymers, siloxanes, silsesquioxanes, and carbosilanes. The oligomers include polyhedral oligomeric silsesquioxanes, carbohydrates, and other cage compounds. These polymers or oligomers are appropriately functionalized with aqueous base soluble groups, acid-labile groups, polar functionalities, and silicon containing groups as needed.

The photoresist formulation typically also comprises a photoacid generator (PAG). The photoacid generator may be any compound that, upon exposure to radiation, generates a strong acid and is compatible with the other components of the photoresist formulation. Examples of photochemical acid generators (PAGs) include, but are not limited to, sulfonates, onium salts, aromatic diazonium salts, sulfonium salts, diaryliodonium salts and sulfonic acid esters of N-hydroxyamides or N-hydroxyimides, as disclosed in U.S. Pat. No. 4,371,605 to Renner. Any PAG(s) incorporated into the present photoresists should have high thermal stability, i.e., be stable to at least 140° C., so they are not degraded during pre-exposure processing.

Any suitable photoacid generator can be used in the photoresist formulations of the invention. Typical photoacid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl) diazomethane, and bis(cyclohexylsulfonyl) diazomethane;

(4) trifluoromethanesulfonate esters of imides and hydroxyimides, e.g., α-(trifluoromethylsulfonyloxy)-bicyclo[2.2.1]hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones;

(10) s-triazine derivatives, as described in U.S. Pat. No. 4,189,323; and

(11) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

Other suitable photoacid generators are disclosed in Reichmanis et al., *Chemistry of Materials* 3:395 (1991), and in U.S. Pat. No. 5,679,495 to Yamachika et al.

Photoacid generators may be incorporated into the photoresist polymer itself. In the areas exposed to the ultraviolet radiation, the polymer-bound PAG will be photochemically converted into, for example, a polymer-bound sulfonic acid group. Suitable monomers bearing PAG substituents are well known in the literature.

Additional suitable acid generators useful in conjunction with the compositions and methods provided herein will be known to those skilled in the art and/or are described in the pertinent literature.

If necessary or desirable, the photoresist formulation (before addition of the additive polymers of the present invention) may include additives, such as dyes, sensitizers, additives used as stabilizers, dissolution modifying agents or dissolution inhibitors, and acid-diffusion controlling agents, basic compounds, photodestructible bases (PDBs), acid amplifiers (AAs), coating aids such as surfactants or antifoaming agents, crosslinking agents, photospeed control agents, adhesion promoters and plasticizers.

Dyes that may be used to adjust the optical density of the formulated photoresist and sensitizers that enhance the activity of photoacid generators by absorbing radiation and transferring it to the photoacid generator. Examples of dyes and sensitizers include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

In one embodiment, the photoresist formulation includes about 1 percent by weight to about 40 percent by weight of dissolution modifying agent or dissolution inhibitor (before addition of the additive polymers of the embodiments of the present invention). In another embodiment, the photoresist formulation includes about 5 percent by weight to about 30 percent by weight of dissolution modifying agent or dissolution inhibitor (before addition of the additive polymers of the embodiments of the present invention).

In another embodiment, the dissolution modifying agents and inhibitors have high solubility in the photoresist formulation and in the casting solvent of the photoresist formulation and exhibit strong dissolution inhibition, have a high exposed dissolution rate, are substantially transparent at the wavelength of interest, may exhibit a moderating influence on Tg, strong etch resistance, and display good thermal stability (i.e., stability at temperatures of about 140° C. or greater). Suitable dissolution inhibitors include, but are not limited to, bisphenol-A derivatives (e.g., wherein one or both hydroxyl moieties are converted to a t-butoxy substituent or a derivative thereof such as a t-butoxycarbonyl or t-butoxycarbonylmethyl group); fluorinated bisphenol-A derivatives such as $CF_3$-bisphenol A-$OCH_2$(CO)—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; and cyclic acetal groups such as tetrahydrofuranyl, tetrahydropyranyl, and 2-methoxytetrahydro-pyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al., *J. Photopolym. Sci. Technol.* 8:623 (1995)), cited supra; hydroxyl-substituted analogs of such compounds (ibid.); and androstane-17-alkylcarboxylates substituted with one to three C1-C4 fluoroalkyl carbonyloxy substituents, such as t-butyl trifluoroacetyllithocholate (see, e.g., U.S. Pat. No. 5,580,694 to Allen et al.).

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Surfactants may be used to improve coating uniformity, and include a wide variety of ionic and non-ionic, monomeric, oligomeric, and polymeric species.

A wide variety of anti-foaming agents may be employed to suppress coating defects.

Adhesion promoters may be used as well; again, a wide variety of compounds may be employed to serve this function.

A wide variety of monomeric, oligomeric, and polymeric plasticizers such as oligo- and polyethyleneglycol ethers, cycloaliphatic esters, and non-acid reactive steroidally derived materials may be used as plasticizers, if desired. However, neither the classes of compounds nor the specific compounds mentioned above are intended to be comprehensive and/or limiting.

One skilled in the art will recognize the wide spectrum of commercially available products that may be used to carry out the types of functions that these additives described supra perform.

In one embodiment, the sum of all additives of the photoresist formulation (before addition of the additive polymers of the present invention) will comprise less than 20 percent by weight of the solids included in the photoresist formulation. In another embodiment, the sum of all additives of the photoresist formulation (before addition of the additive polymers of the present invention) will comprise less than 5 percent by weight photoresist formulation.

The remainder of the photoresist formulation is composed of a casting solvent. The choice of casting solvent is governed by many factors not limited to the solubility and miscibility of photoresist components, the coating process, and safety and environmental regulations. Additionally, inertness to other photoresist components is desirable. In one embodiment, the casting solvent may possess the appropriate volatility to allow uniform coating of films yet also allow significant reduction or complete removal of residual solvent during the post-application bake process. See, e.g., *Introduction to Microlithography*, Eds. Thompson et al. Where the photoresist formulation is used in a multilayer imaging process, the casting solvent used in the imaging layer photoresist is preferably not a solvent to the underlying materials, otherwise the unwanted intermixing may occur. The invention is not limited to selection of any particular casting solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as propylene glycol methyl ether acetate (PGMEA), alkylene glycol monoalkyl esters such as methyl cellosolve, butyl acetate, and 2-ethoxyethanol. In one embodiment, solvents include ethyl lactate, propylene glycol methyl ether acetate, ethyl 3-ethoxypropionate and their mixtures. The above list of casting solvents is for illustrative purposes only and should not be viewed as being comprehensive nor should the choice of solvent be viewed as limiting the invention in any way. Those skilled in the art will recognize that any number of solvents or solvent mixtures may be used as casting solvents.

In one embodiment, greater than about 50 percent of the total weight of the photoresist formulation (before addition of the additive polymers of the present invention) comprises casting solvent. In another embodiment, greater than about 80 percent of the total weight of the photoresist formulation (before addition of the additive polymers of the present invention) comprises casting solvent.

In another embodiment of the present invention, there is provided a method of patterning a topcoat-free photoresist comprising the topcoat-free photoresist composition of the present invention. In one embodiment, the method of patterning the topcoat-free photoresist uses 193 nm water immersion lithography. In another embodiment, the additive polymer comprises a repeat unit having a sulfonamide group and a branched linking group. In a further embodiment, the additive polymer comprises a repeat unit having a trifluoromethanesulfonamide group and a branched linking group.

A method of using the topcoat-free photoresist composition of the present invention to pattern the topcoat-free photoresist comprises the steps of:
  (a) applying a layer of the inventive topcoat-free photoresist composition of the present invention on a substrate;
  (b) optionally, baking the topcoat-free photoresist;
  (c) patternwise exposing the topcoat-free photoresist;
  (d) optionally, baking the exposed topcoat-free photoresist; and
  (e) developing the topcoat-free photoresist to selectively remove portions of the topcoat-free photoresist.

The topcoat-free photoresist is typically applied on a substrate by spin coating; however, spray coating, dip coating, doctor blading, roll coating, and the like may also be used. The substrate may comprise a wafer or sheet of an inorganic material, including silicon and silicon dioxide, and other inorganic oxides, nitrides, and carbides. The substrate may also comprise one or more additional layers including single or multilayer BARCs, patterned photoresists, spin-on carbon layers, planarization layers, cap layers, seed layers, dielectric layers, metal layers, and other underlying levels of a semiconductor device.

After application of the topcoat-free photoresist, the substrate may be optionally baked at an elevated temperature to remove residual casting solvent and densify the topcoat-free photoresist film. Typical post-application bake (PAB) temperatures range from 60° C. to 150° C., more typically from 70° C. to 120° C., and even more typically from 80° C. to 100° C. Post-application bakes may last from 1 second to 10 minutes or more, although typical post-application bakes last for 30 to 90 seconds.

The film thickness of the topcoat-free photoresist may range from 1 nm to 5000 nm. Typical topcoat-free photoresist thicknesses used in 193 nm water immersion lithography range from 40 to 150 nm. Thinner photoresist thicknesses may be required for EUV or e-beam lithography and thicker layers may be required for 248 nm, 365 nm, or 436 nm lithography.

The photoresist may be exposed using ultraviolet radiation (e.g., i-line or g-line), deep ultraviolet radiation (e.g., wavelength <260 nm), extreme ultraviolet radiation, or electron beam radiation. Particularly useful wavelengths include 254 nm, 248 nm, 193 nm, 157 nm, and 13.5 nm. In an embodiment, the photoresist may be exposed using 193 nm immersion lithography. In a further embodiment, the topcoat-free photoresist may be exposed using 193 nm water immersion lithography. Water is a particularly suitable immersion fluid due to it high transparency, good refractive index, good surface tension to viscosity ratio, good thermal properties, low cost, low toxicity, and ready availability in high purity.

Alternative immersion fluids include aqueous solutions of acids, ionic species including inorganic salts and ammonium salts), water-soluble organic compounds, surfactants, micelles, and nanoparticles. Further immersion fluids include hydrocarbon liquids. Hydrocarbon immersion fluids may comprise linear, branched, cyclic, and polycyclic saturated alkanes. Amongst these, saturated polycyclic alkanes of 8 to 12 carbons have particularly advantageous combinations of high refractive index and adequate transparency at 193 nm. Examples of hydrocarbon immersion fluids include octahydroindene, 1,1-bicyclohexyl, cis-decahydronaphthalene, trans-decahydronaphthalene, cis/trans-decahydronaphthalene, and exo-tetrahydrodicyclopentadiene. Water- and hydrocarbon-based immersion fluids may also further comprise nanoparticles. Examples of suitable nanoparticle materials include hafnium oxide, lutetium aluminum garnet, magnesium oxide, alumina, silicon dioxide. The nanoparticles may also comprise ligands or surface grafted surfactants which will stabilize the nanoparticle dispersions and prevent aggregation.

After exposure, the topcoat-free photoresist may optionally be subjected to a post exposure bake (PEB) to drive the chemical reaction. PEB temperatures may range from 50 to 150° C., more particularly between 60 to 140° C., and even more particularly between 70 to 130° C. Post-exposure bake processes may last from 1 second to 10 minutes, more preferably from 2 seconds to 2 minutes, and even more preferably from 10 seconds to 1 minute.

The particular composition of the developer used to develop the topcoat-free photoresist will depend upon the photoresist material, the additive, and the desired tone of the resulting pattern.

In one embodiment, the topcoat-free photoresist is developed using standard alkaline photoresist developer (usually 0.26 N aqueous tetramethylammonium hydroxide).

In another embodiment, the topcoat-free photoresist may be developed using an organic solvent. If the exposed regions of the photoresist are to be removed, suitable example organic solvents include ethylene glycol, propylene glycol, isopropanol, and mixtures thereof. If a crosslinking negative-tone topcoat-free photoresist is used, a large variety of organic solvents may be used to selectively remove the non-exposed photoresist material as long as swelling of the crosslinked photoresist material remains within acceptable limits. If the topcoat-free photoresist operates via a polarity change mechanism rather than via a crosslinking mechanism, a selective organic solvent must be used to dissolve only the non-exposed regions. Suitable organic solvents for this purpose include anisole and n-butyl acetate.

Alternatively, the surface enrichment layer of the additive polymer at the air interface of the photoresist film may be selectively removed with an organic solvent prior to development of the underlying photoresist material. Such removal of the additive may be performed prior to or after the optical PEB process.

The resultant photoresist pattern may be used directly or further manipulated. Additional manipulations include various lithographic, surface modification, trim, and deposition processes, especially those required for double patterning lithographic processes. The photoresist pattern may be used to protect the substrate during ion implantation. In particular, the photoresist pattern may ultimately be transferred to the underlying substrate. Pattern transfer may be accomplished by either dry or wet etch processes. In particular, a reactive ion etch (RIE) using oxygen or a fluorine-containing gas may be used to transfer the pattern depending upon the chemistry of the substrate. If the substrate comprises a bottom anti-reflective coating (BARC) layer, a breakthrough etch process may be required prior to transfer of the pattern into the underlying substrate. If a photoimageable or developable BARC is used, such a process may not be required. If the pattern is transferred into a dielectric material such as an oxide layer, the resulting features may be lined and then filled with a conductive metal such as aluminum, copper, or tungsten to form metal wires, interconnects, and contacts.

It is to be understood that while the invention has been described in conjunction with the embodiments set forth above, the foregoing description as well as the examples that follow are intended to illustrate and not limit the scope of the invention. It is also to be understood that the embodiments and examples set forth herein are not exhaustive and that modifications and variations of the invention will be apparent to those of ordinary skill in the art without departing from the scope and spirit of the invention.

All patents and publications mentioned herein are incorporated by reference in their entireties.

EXPERIMENTAL

The following examples are set forth to provide those of ordinary skill in the art with a complete disclosure of how to make and use the aspects and embodiments of the invention as set forth herein. While efforts have been made to ensure accuracy with respect to variables such as amounts, temperature, etc., experimental error and deviations should be taken into account. All components were obtained commercially unless otherwise indicated.

Unless indicated otherwise, parts are parts by weight, temperature is in ° C. and pressure is at or near atmospheric. 1,1,1,3,3,3-Hexafluoroprop-2-yl methacrylate (HFIMPA), 5/6-((trifluoromethylsulfonamido)methyl)bicyclo[2.2.1] heptan-2-ylmethacrylate (AMNB-Tf-MA), 2-(trifluoromethylsulfonamido)ethyl methacrylate (EATf-MA), 5/6-(3,3,3-trifluoro-2-hydroxy-2-(trifluoromethyl)propyl)bicyclo [2.2.1]heptan-2-ylmethacrylate (NBHFAMA), 1-cyclohexyl-4,4,4-trifluoro-3-hydroxy-3-(trifluoromethyl) but-1-yl methacrylate (MA-ACH-HFA), and 1,1,1-trifluoro-2-trifluoromethyl-2-hydroxy-pentan-4-ylmethacrylate (MA-BTHB-OH) were obtained from Central Glass Co. Ltd. (Tokyo, Japan). 2,2'-Azobis(2-methylpropionitrile) (AIBN) was obtained from Sigma-Aldrich (St. Louis, Mo., USA). TCX-014, TCX-041, AR16882J, AM2073J, and AIM5570JN were obtained from JSR Micro (Sunnyvale, Calif., USA). TSP-3A was obtained from Tokyo Ohko Kogyo (TOK) (Tokyo, Japan). Additionally, all the other starting materials were obtained commercially or were synthesized using known procedures.

Where appropriate, the following techniques and equipment were utilized in the examples: $^1H$, $^{13}C$ and $^{19}F$ NMR spectra were obtained at room temperature on an Avance 400 spectrometer. Quantitative inverse-gated $^{13}C$ NMR spectra were obtained using $Cr(acac)_3$ as a relaxation agent in acetone-$d_6$. Thermo-gravimetric analysis (TGA) was performed at a heating rate of 5° C./min in $N_2$ on a TA Instrument Hi-Res TGA 2950 Thermogravimetric Analyzer. Differential scanning calorimetry (DSC) was performed at a heating rate of 5° C./min on a TA Instruments DSC 2920 modulated differential scanning calorimeter. The sample was ramped to 130° C., cooled to room temperature, and then ramped to 250° C. Glass transition temperatures were determined using data from the second heating run. Molecular weights were measured using size-exclusion chromatography with a Waters Model 150 chromatograph relative to polystyrene standards using tetrahydrofuran (THF) as an eluent. IR spectra were recorded on a Nicolet 510 FT-IR spectrometer on a film cast on a KBr plate. Film thickness was measured on a Tencor alpha-step 2000 or Nanospec. A quartz crystal microbalance (QCM) with a MAXTEC Inc. PLO-10 Phase lock oscillator was used to study the dissolution kinetics of the resist films in an aqueous 0.26N tetramethylammonium hydroxide (TMAH) solution (FujiFILM Optiyield CD). Lithographic evaluation was performed on a 193 nm dry exposure tool (ISI, 0.6NA, COG mask) or a 193 nm interferometric exposure tool.

Water contact angles were measured on an OCA video based contact angle system from FDS Future Digital Scientific Corporation (New York, N.Y., USA), using the sessile drop method on polymer mixtures after baking to drive out the casting solvent. The contact angle reported is the angle between the solid surface on which the drop is formed and the tangent to the drop surface at the drop surface/solid surface interface. The advancing and receding contact angles were measured using a tilting stage method. Presented static contact angles are a calculated average of four measurements of a 2 µL deionized water drop. Static contact angles (SCAs) are measured on an un-tilted substrate (i.e., on a horizontal surface parallel to the ground). Tilting contact angles are measured by placing a 50 µL drop of deionized water on the substrate. The substrate is thereafter tilted in an increasingly vertical direction (relative to the horizontal direction) until the droplet starts moving. The static advancing contact angle (SACA), static receding contact angle (SRCA), and tilt angle is recorded just before the drop starts moving. Presented advancing and receding water contact angles are calculated from an average of between 3 and 5 measurements. Contact angle hysteresis is the difference between the SACA and the SRCA.

One objective of using a topcoat is to prevent leaching of extractable components from the photoresist into the immersion liquid. Extraction of resist components into water was evaluated using WEXA (Water Extraction Apparatus, see Allen et. al., *J. Photopolym. Sci. & Tech.* 18(5):615-619 (2005)). Selected materials in the present invention were set in contact with water in a controlled reproducible manner (time, speed, volume, contact area, etc.). The water was thereafter collected and analyzed for extractable components by MPI Research (State College, Pa., USA) using LC/MS/MS. Reported are the amounts of sulfonate extractable components originating from the PAG (photoacid generator) that is a component of the resist. For ease of understanding, the amount is reported as percent extractables measured using a topcoat covered by the present invention as compared to without using a topcoat. In all cases, the extractable components were much lower after the addition of a topcoat to the resist.

Examples 2-15 below describe the synthesis of polymers from known sulfonamide-containing methacrylate monomers and Examples 16-31 describe the synthesis of polymers from methacrylate monomers comprising a sulfonamide group and a branched linking group of the present invention. Example 32 presents a comparison of the lithographic performance of known/comparative and inventive topcoat materials. Example 33 presents a comparison of the lithographic performance of known/comparative and inventive additive polymers in topcoat-free photoresists.

In examples 2-33, materials are labeled according to the following abbreviations: P=polymer, TC=topcoat polymer, A=additive polymer, R=photoresist, and TCF-R=topcoat-free photoresist. In some cases, a material may be evaluated as both a topcoat and as an additive polymer and, therefore, may be designated by multiple labels.

EXAMPLE 1

Synthetic Polymerization

A representative free-radical polymerization procedure used to prepare the polymers herein is as follows: to a 100 mL round-bottom flask, monomer (1 eq.) and 2,2'-azobis(2-methylpropionitrile) (AIBN) (0.04 eq.) was added. Methyl ethyl ketone (OMNISOLV®, reagent grade, EM Industries, Hawthorne, N.Y., USA) was added to afford about 25 percent by weight solids solution. A reflux condenser with a rubber septum was added and the oxygen was removed from the solution by three sequential pump-backfill cycles using nitrogen while stirring vigorously. The flask was placed under positive nitrogen pressure prior to heating the reaction at reflux overnight. After the reaction was complete, the reaction mixture was cooled to room temperature and the polymer solution was precipitated into a non-solvent (typically, hexane or methanol). The precipitated polymer was collected on a ceramic frit Buchner funnel (medium porosity). The polymer was reprecipitated from methyl ethyl ketone into the non-solvent as many times as necessary to remove residual uncreated monomer and other polymerization by-products (typically, 2-3 total precipitations). The final polymer was isolated on a ceramic frit Buchner funnel (medium porosity) and washed with excess non-solvent. The polymer was dried under vacuum overnight between 70° C. to 80° C., after which time, it was allowed to cool to room temperature under vacuum.

EXAMPLE 2

Synthesis of Comparative Material Poly(MA-BTHB-OH) (P1)

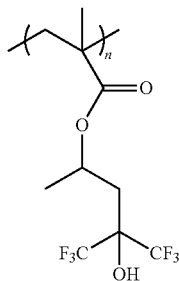

To a 100 mL roundbottom flask, 5,5,5-trifluoro-4-hydroxy-4-(trifluoromethyl)pentan-2-yl methacrylate (MA-BTHB-OH) (5.0 g, 17.0 mmol), 2,2'-azobis(2-methylpropionitrile) (AIBN) (112 mg, 0.04 eq.), and methyl ethyl ketone (15 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of hexanes. The polymer was isolated using a medium porosity ceramic fritted Buchner funnel. The polymer was washed 1 time with hexanes prior to drying in vacuo at 80° C. overnight. The polymer was allowed to cool to room temperature under vacuum prior to determining the yield. Yield: 3.9 g (78%). $M_n$: 8350. PDI: 1.73. $T_g$: 104° C. Dissolution rate in 0.26N TMAH: 145 nm/s. SCA: 84.6°, SACA: 86.1°, SRCA: 70.0°, Hyst. 16.1°, Tilt: 14.5°.

EXAMPLE 3

Synthesis of Comparative Material Poly(NBHFAMA) (P2)

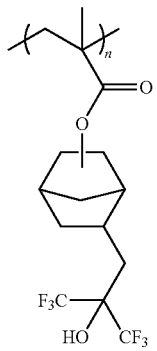

To a 100 mL roundbottom flask, 5/6-(3,3,3-trifluoro-2-hydroxy-2-(trifluoromethyl)propyl)bicyclo[2.2.1]heptan-2-ylmethacrylate (NBHFAMA) (3.0 g, 8.3 mmol), 1-dodecanethiol (50 mg, 0.25 mmol, 0.03 eq.), 2,2'-azobis(2-methylpropionitrile) (AIBN) (55 mg, 0.04 eq.), and tetrahydrofuran (8 mL) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into 500 mL of hexanes. Upon final isolation on the Buchner funnel, the polymer was washed 1 time with hexanes. The polymer was dried in vacuo at 80° C. overnight. The polymer was allowed to cool to room temperature under vacuum prior to determining the yield. Yield: 1.73 g (58%). $M_n$: 9290. PDI: 1.32. $T_g$: 159° C. Dissolution rate in 0.26N TMAH: 0.4 nm/s. SCA: 77.3°, SACA: 81.4°, SRCA: 64.5°, Hyst. 16.9°, Tilt: 15.3°.

EXAMPLE 4

Synthesis of Comparative Material Poly(EATf-MA) (P3)

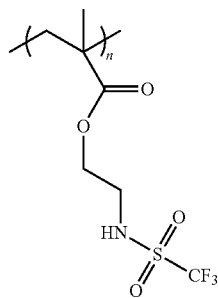

To a roundbottom flask, 2-(trifluoromethylsulfonamido)ethyl methacrylate (EATf-MA) (13.06 g, 50 mmol), 1-dodecanethiol (202 mg, 1 mmol, 0.02 eq.), and methyl ethyl ketone (40 mL) were added. A reflux condenser and septa were added. The reaction vessel was flushed with nitrogen and heated to reflux under a nitrogen atmosphere. The flask was cooled slightly and 2,2'-azobis(2-methylpropionitrile) (AIBN) (324 mg, 0.04 eq.) was added under a nitrogen flow. The reaction vessel was then reheated to reflux and allowed to react overnight. Upon completion the reaction flask was cooled to room temperature and the polymer precipitated into 3.5 L of hexanes and stirred for 30 minutes. The polymer was isolated using a medium porosity ceramic fitted Buchner funnel, washed 3×150 mL of hexanes, and vacuumed dry. The polymer was dried in vacuo at 80° C. overnight. The polymer was allowed to cool to room temperature under vacuum. $T_g$: 73° C. Dissolution rate in 0.26N TMAH: 3000 nm/s. SCA: 74.1°, SACA: 84.2°, SRCA: 47.0°, Hyst. 37.2°, Tilt: 34.7°.

EXAMPLE 5

Synthesis of Comparative Material Poly(1,4-CHTf-MA) (P4)

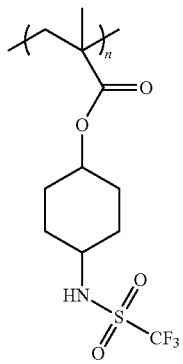

To a 100 mL roundbottom flask, 4-(trifluoromethylsulfonamido)cyclohexyl methacrylate (1,4-CHTf-MA) (2.9 g, 11 mmol), 2,2'-azobis(2-methylpropionitrile) (AIBN) (70 mg, 0.04 eq.), and methyl ethyl ketone (12 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into 150 mL of hexane. The polymer was isolated using a medium porosity ceramic fritted Buchner funnel. The white polymer was redissolved into a minimal amount of methyl ethyl ketone and the precipitation process repeated 1 time. Upon final isolation on the Buchner funnel, the polymer was washed 1 time with hexane. The polymer was dried in vacuo at 80° C. overnight. The polymer was allowed to cool to room temperature under vacuum prior to determining the yield. Yield: 2.6 g (89%). $M_n$: 7930. PDI: 1.3. $T_g$: 180° C. Dissolution rate in 0.26N TMAH: 220 nm/s. SCA: 64.8°, SACA: 81.1°, SRCA: 47.8°, Hyst. 33.3°, Tilt: 30.7°.

EXAMPLE 6

Synthesis of Comparative Material Poly(AMNB-Tf-MA) (P5)

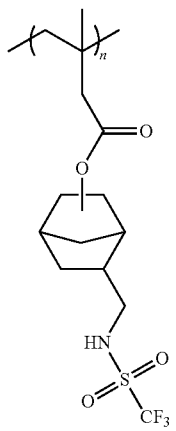

To a 100 mL roundbottom flask, 5/6-(trifluoromethylsulfonamido)methyl)bicyclo[2.2.1]heptan-2-yl methacrylate (AMNB-Tf-MA) (3 g, 8.79 mmol), 2,2'-azobis(2-methylpropionitrile) (AIBN) (58 mg, 0.04 eq.), 1-dodecanethiol (36 mg, 0.02 eq.) and methyl ethyl ketone (12 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into 160 mL of hexane. The polymer was isolated using a medium porosity ceramic fritted Buchner funnel. The white polymer was redissolved into a minimal amount of methyl ethyl ketone and the precipitation process repeated 1 time. Upon final isolation on the Buchner funnel, the polymer was washed 1 time with hexane. The polymer was dried in vacuo at 80° C. overnight. The polymer was allowed to cool to room temperature under vacuum prior to determining the yield. Yield: 2.57 g (86%). $M_n$: 11360. PDI: 1.47. $T_g$: 148° C. Dissolution rate in 0.26N TMAH: 150 nm/s. SCA: 69°, SACA: 76°, SRCA: 56°, Hyst. 20°, Tilt: 18°.

EXAMPLE 7

Synthesis of Comparative Material Poly(MA-BTHB-OH/HFIPMA) (95:10) (TC4)

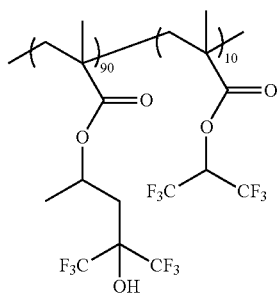

Polymer was obtained from Central Glass Co. Ltd. (Tokyo, Japan) The ratio of MA-BTHB-OH:HFIPMA incorporated into the polymer was 90:10 as determined by $^{19}$F NMR. The final composition was 88:12 as determined by inverse-gated $^{13}$C NMR using Cr(acac)$_3$ as a relaxation agent in acetone-d6. $M_n$: 9720 g/mol. PDI: 1.36. $T_g$: 100° C. Dissolution rate in 0.26N TMAH: 22 nm/s. SCA: 87.9°, SACA: 89.1°, SRCA: 69.4°, Hyst. 19.7°, Tilt: 17.7°.

EXAMPLE 8

Synthesis of Comparative Material Poly(MA-BTHB-OH/HFIPMA) (80:20) (TC5)

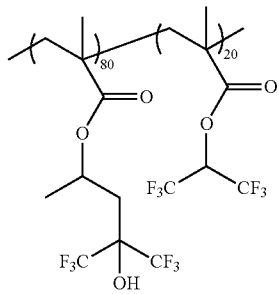

Polymer was obtained from Central Glass Co. Ltd. (Tokyo, Japan). The ratio of MA-BTHB-OH:HFIPMA incorporated into the polymer was 80:20 as determined by $^{19}$F NMR. The final composition was 79:21 as determined by inverse-gated $^{13}$C NMR using Cr(acac)$_3$ as a relaxation agent in acetone-d6. $M_n$: 10540 g/mol. PDI: 1.28. $T_g$: 92° C. Dissolution rate in 0.26N TMAH: 2.4 nm/s. SCA: 89.6°, SACA: 89.4°, SRCA: 72.2°, Hyst. 17.2°, Tilt: 16.4°.

EXAMPLE 9

Synthesis of Comparative Material Poly(EATf-MA/HFIPMA) (70:30) (TC6)

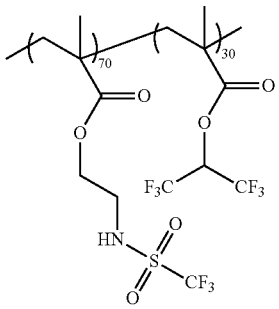

To a 100 mL roundbottom flask, 2-(trifluoromethylsulfonamido)ethyl methacrylate (EATf-MA) (4.00 g, 15.3 mmol, 0.7 eq.), 1,1,1,3,3,3-hexafluoropropan-2-yl methacrylate (HFIPMA) (1.55 g, 6.56 mmol, 0.3 eq.), 2,2'-azobis(2-methylpropionitrile) (AIBN) (72 mg, 0.02 eq.), and methyl ethyl ketone (12 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the reaction mixture concentrated to ~60% of the original volume in vacuo. The polymer was precipitated into 150 mL of Novec™ HFE-7100 (3M™ Corporation). The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was dried in vacuo at 80° C. overnight. The polymer was allowed to cool to room temperature under vacuum prior to determining the yield. The ratio of EATf-MA:HFIPMA incorporated into the polymer was 74:26 as determined by $^{19}$F NMR. The final composition was 74:26 as determined by inverse-gated $^{13}$C NMR using Cr(acac)$_3$ as a relaxation agent in acetone-d6. Yield: 3.3 g (60%). $T_g$: 93° C. Dissolution rate in 0.26N TMAH: 400 nm/s. SCA: 83.9°, SACA: 92.6°, SRCA: 61.1°, Hyst. 31.5°, Tilt: 28.2°.

EXAMPLE 10

Synthesis of Comparative Material Poly(MA-ACH-HFA/EATf-MA) (70:30) (A1)

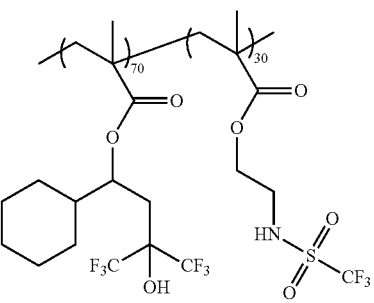

To a 100 mL roundbottom flask, 2-(trifluoromethylsulfonamido)ethyl methacrylate (EATf-MA) (0.77 g, 2.96 mmol, 0.3 eq.), 1-cyclohexyl-4,4,4-trifluoro-3-hydroxy-3-(trifluoromethyl)butan-1-yl methacrylate (MA-ACH-HFA) (2.5 g, 6.90 mmol, 0.70 eq.), 2,2'-azobis(2-methylpropionitrile) (AIBN) (64.7 mg, 0.04 eq.), and methyl ethyl ketone (7 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the solvent removed in vacuo until a thick liquid was obtained. Novec™ HFE-7100 (80 mL) was added to the flask to precipitate the polymer. The polymer was stirred in the HFE-7100 for 30 minutes and was isolated using a medium porosity ceramic fritted Buchner funnel. The white polymer was resuspended into 80 mL of HFE-7100 and stirred for an additional 15 minutes. After final isolation of the polymer with a Buchner funnel, the polymer was dried in vacuo at 80° C. overnight. The polymer was allowed to cool to room temperature under vacuum prior to determining the yield. The ratio of MA-ACH-HFA: EATf-MA incorporated into the polymer was 67:33 as determined by $^{19}$F NMR. The final composition was 65:35 as determined by inverse-gated $^{13}$C NMR using Cr(acac)$_3$ as a relaxation agent in acetone-d6. Yield: 2.11 g (65%). $M_n$: 3240 g/mol. PDI: 1.84. $T_g$: 89° C. Dissolution rate in 0.26N TMAH: 0 nm/s. SCA: 91.6°, SACA: 91.7°, SRCA: 74.8°, Hyst. 16.9°, Tilt: 15.5°.

EXAMPLE 11

Synthesis of Comparative Material Poly(MA-BTHB-OH/ECPMA/HFIPMA) (20:50:30) (A2)

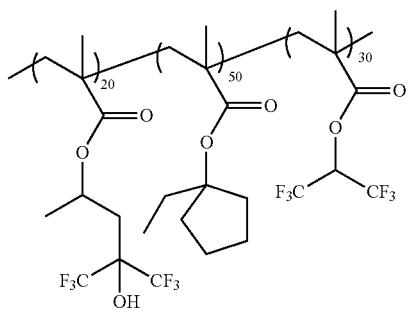

Prepared from 5,5,5-trifluoro-4-hydroxy-4-(trifluoromethyl)pentan-2-ylmethacrylate (MA-BTHB-OH), 1-ethylcyclopentyl methacrylate (ECPMA), and 1,1,1,3,3,3-hexafluoropropan-2-yl methacrylate (HFIPMA) according to the procedure outlined in Allen et al. US 2008/0193879A1. The ratio of MA-BTHB-OH:HFIPMA incorporated into the polymer was 1.00:1.36 as determined by $^{19}$F NMR. The final composition was 19:47:34 as determined by inverse-gated $^{13}$C NMR using Cr(acac)$_3$ as a relaxation agent in acetone-d6. $M_n$: 3570 g/mol. PDI: 1.44. $T_g$: 59° C. Dissolution rate in 0.26N TMAH: 0 nm/s. SCA: 95.7°, SACA: 98.5°, SRCA: 77.2°, Hyst. 21.3°, Tilt: 18.1°.

EXAMPLE 12

Synthesis of Comparative Mwterial Poly(EATf-MA/ECPMA/HFIPMA) (20:50:30) (A3)

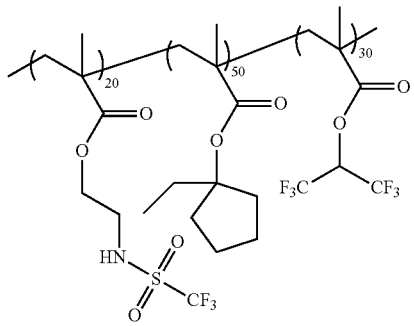

To a 100 mL roundbottom flask, 2-(trifluoromethylsulfonamido)ethyl methacrylate (EATf-MA) (2.00 g, 7.66 mmol, 0.2 eq.), 1-ethylcyclopentyl methacrylate (ECPMA) (3.68 g, 19.1 mmol, 0.5 eq.), 1,1,1,3,3,3-hexafluoropropan-2-yl methacrylate (HFIPMA) (2.70 g, 11.5 mmol, 0.3 eq.), 2,2'-azobis(2-methylpropionitrile) (AIBN) (126 mg, 0.02 eq.), and methyl ethyl ketone (16.8 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the reaction mixture concentrated to ~60% of the original volume in vacuo. The polymer was precipitated into a 150 mL of Novec™ HFE-7100 (3M Corporation). The polymer was isolated using a medium porosity ceramic fitted Buchner funnel. The white polymer was redissolved into a minimal amount of methyl ethyl ketone and the precipitation process repeated one time. Upon final isolation on the Buchner funnel, the polymer was dried in vacuo at 80° C. overnight. The polymer was allowed to cool to room temperature under vacuum prior to determining the yield. The ratio of EATf-MA:HFIPMA incorporated into the polymer was 1.0:1.37 as determined by $^{19}$F NMR. The final composition was 19:53:27 as determined by inverse-gated $^{13}$C NMR using Cr(acac)$_3$ as a relaxation agent in acetone-d6. Yield: 3.9 g (47%). $M_n$: 9680 g/mol. PDI: 1.38. $T_g$: 95° C. Dissolution rate in 0.26N TMAH: 0 nm/s. SCA: 96.4°, SACA: 96.4°, SRCA: 73.6°, Hyst. 22.8°, Tilt: 20.0°.

EXAMPLE 13

Synthesis of Comparative Masterial Poly(MA-BTHB-OH/ECPMA/3FMA) (10:70:20) (A4)

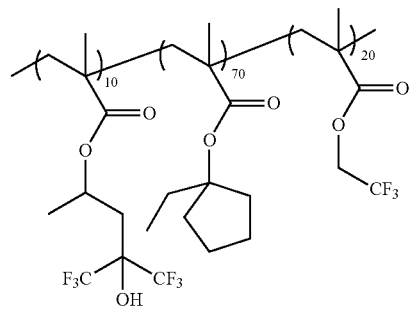

Prepared from 5,5,5-trifluoro-4-hydroxy-4-(trifluoromethyl)pentan-2-ylmethacrylate (MA-BTHB-OH), 1-ethylcyclopentyl methacrylate (ECPMA), and 2,2,2-trifluoroethyl methacrylate (3FMA) according to the procedure outlined in Allen et al. US 2008/0193879A1. The ratio of MA-BTHB-OH:3FMA incorporated into the polymer was 1.0:2.04 as determined by $^{19}$F NMR. The final composition was 7:73:20 as determined by inverse-gated $^{13}$C NMR using Cr(acac)$_3$ as a relaxation agent in acetone-d6. $M_n$: 2660 g/mol. PDI: 1.63. $T_g$: 75° C. Dissolution rate in 0.26N TMAH: 0 nm/s. SCA: 89.7°, SACA: 89.6°, SRCA: 68.6°, Hyst. 21.0°, Tilt: 19.4°.

EXAMPLE 14

Synthesis of Comparative Material Poly(NBHFAMA/ECPMA/3FMA) (10:70:20) (A5)

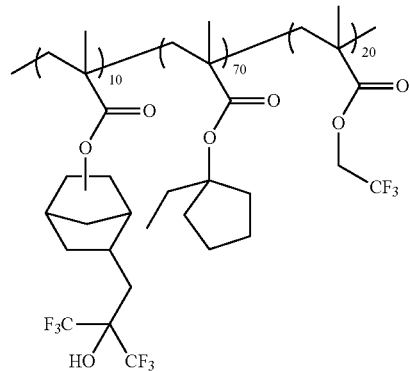

Prepared from 5/6-(3,3,3-trifluoro-2-hydroxy-2-(trifluoromethyl)propyl)bicyclo[2.2.1]heptan-2-ylmethacrylate (NBHFAMA), 1-ethylcyclopentyl methacrylate (ECPMA), and 2,2,2-trifluoroethyl methacrylate (3FMA) according to the procedure outlined in Allen et al. US 2008/0193879A1. The ratio of NBHFAMA:3FMA incorporated into the polymer was 1.0:2.17 as determined by $^{19}$F NMR. The final composition was 19:72:9 as determined by inverse-gated $^{13}$C NMR using Cr(acac)$_3$ as a relaxation agent in acetone-d6. $M_n$: 3000 g/mol. PDI: 1.55. $T_g$: 58° C. Dissolution rate in 0.26N TMAH: 0 nm/s. SCA: 90.1°, SACA: 89.6°, SRCA: 71.5°, Hyst. 18.1°, Tilt: 17.8°.

EXAMPLE 15

Synthesis of Comparative Material
Poly(EATf-MA/ECPMA/3FMA) (10:70:20) (A6)

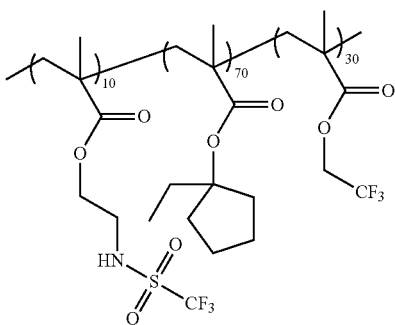

To a 100 mL roundbottom flask, 2-(trifluoromethylsulfonamido)ethyl methacrylate (EATf-MA) (1 g, 3.83 mmol, 0.1 eq.), 1-ethylcyclopentyl methacrylate (ECPMA) (4.88 g, 26.8 mmol, 0.7 eq.), 2,2,2-trifluoroethyl methacrylate (3FMA) (1.29 g, 7.66 mmol, 0.2 eq.), 2,2'-azobis(2-methylpropionitrile) (AIBN) (251 mg, 0.04 eq.), and methyl ethyl ketone (21 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of methanol. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with methanol. The polymer was dried in vacuo at 80° C. overnight. The polymer was allowed to cool to room temperature under vacuum prior to determining the yield. The ratio of EATf-MA:3FMA incorporated into the polymer was 1:2.13 as determined by $^{19}$F NMR. The final composition was 9:71:20 as determined by inverse-gated $^{13}$C NMR using Cr(acac)$_3$ as a relaxation agent in acetone-d6. Yield: 2.23 g (31%). $M_n$: 6630 g/mol. PDI: 1.56. $T_g$: 82° C. Dissolution rate in 0.26N TMAH: 0 nm/s. SCA: 89.3°, SACA: 88.7°, SRCA: 71.1°, Hyst. 17.7°, Tilt: 16.4°.

EXAMPLE 16

Synthesis of Inventive Material
Poly(1-Me-EATf-MA) (P6)

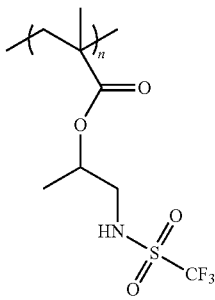

To a 100 mL roundbottom flask, 1-(trifluoromethylsulfonamido)propan-2-yl methacrylate (1-Me-EATf-MA) (2.0 g, 7.3 mmol), 2,2'-azobis(2-methylpropionitrile) (AIBN) (48 mg, 0.04 eq.), and methyl ethyl ketone (6 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into 500 mL of hexanes. The polymer was isolated using a medium porosity ceramic fritted Buchner funnel. The white polymer was redissolved into a minimal amount of methyl ethyl ketone and the precipitation process repeated 1 time. Upon final isolation on the Buchner funnel, the polymer was washed 1 time with hexanes. The polymer was dried in vacuo at 80° C. overnight. The polymer was allowed to cool to room temperature under vacuum prior to determining the yield. Yield: 1.66 g (64%). $T_g$: 109° C. Dissolution rate in 0.26N TMAH: 1110 nm/s. SCA: 72.9°, SACA: 81.3°, SRCA: 60.6°, Hyst: 20.7°, Tilt: 18.1°.

EXAMPLE 17

Synthesis of Inventive Material
Poly(1-Et-EATf-MA) (P7)

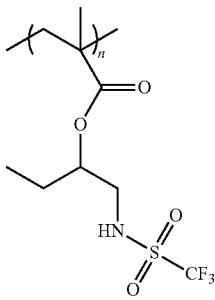

To a 100 mL roundbottom flask, 1-(trifluoromethylsulfonamido)butan-2-yl methacrylate (1-Et-EATf-MA) (2.0 g, 6.9 mmol), 2,2'-azobis(2-methylpropionitrile) (AIBN) (22.5 mg, 0.02 eq.), and methyl ethyl ketone (2 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into 400 mL of hexanes. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with hexanes. The polymer was dried in vacuo at 80° C. overnight. The polymer was allowed to cool to room temperature under vacuum prior to determining the yield. Yield: 1.34 g (67%). $T_g$: 101° C. Dissolution rate in 0.26N TMAH: 455 nm/s. SCA: 78.7°, SACA: 83.3°, SRCA: 66.5°, Hyst: 16.8°, Tilt: 15.1°.

EXAMPLE 18

Synthesis of Inventive Material
Poly(2-Me-EATf-MA) (P8)

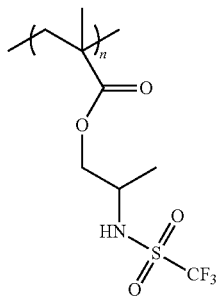

To a 100 mL roundbottom flask, 2-(trifluoromethylsulfonamido)propyl methacrylate (2-Me-EATf-MA) (2.96 g, 10.8 mmol), 2,2'-azobis(2-methylpropionitrile) (AIBN) (70 mg, 0.04 eq.), 1-dodecanethiol (87 mg, 0.02 eq.) and methyl ethyl ketone (12 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into 150 mL of hexane. The polymer was isolated using a medium porosity ceramic fritted Buchner funnel. The white polymer was redissolved into a minimal amount of methyl ethyl ketone and the precipitation process repeated 1 times. Upon final isolation on the Buchner funnel, the polymer was washed 1 time with hexane. The polymer was dried in vacuo at 80° C. overnight. The polymer was allowed to cool to room temperature under vacuum prior to determining the yield. Yield: 2.1 g (72%). $M_n$: 7084 g/mol. PDI: 1.41. $T_g$: 82° C. Dissolution rate in 0.26N TMAH: 1270 nm/s. SCA: 81.6°, SACA: 88.1°, SRCA: 56.0°, Hyst.: 32.1°, Tilt: 29.6°.

EXAMPLE 19

Synthesis of Inventive Material
Poly(2-Et-EATf-MA) (P9)

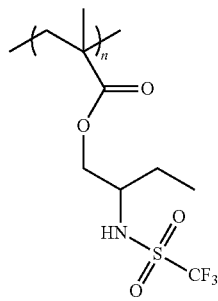

To a 100 mL roundbottom flask, 2-(trifluoromethylsulfonamido)butyl methacrylate (2-Et-EATf-MA) (2.0 g, 6.9 mmol), 2,2'-azobis(2-methylpropionitrile) (AIBN) (45 mg, 0.04 eq.), and methyl ethyl ketone (6 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of hexanes. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with hexanes. The polymer was dried in vacuo at 80° C. overnight. The polymer was allowed to cool to room temperature under vacuum prior to determining the yield. Yield: 1.49 g (75%). $M_n$: 9270 g/mol. PDI: 2.21. $T_g$: 111° C. Dissolution rate in 0.26N TMAH: 430 nm/s. SCA: 79.9°, SACA: 88.4°, SRCA: 61.7°, Hyst.: 26.7°, Tilt: 23.6°.

EXAMPLE 20

Synthesis of Inventive Material
Poly(2-TFE-EATf-MA) (P10)

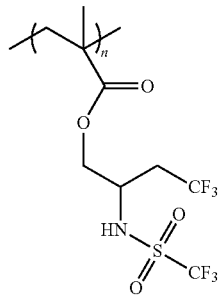

To a 100 mL roundbottom flask, 4,4,4-trifluoro-2-(trifluoromethylsulfonamido)butyl methacrylate (2-TFE-EATf- MA) (2.5 g, 7.3 mmol), 2,2'-azobis(2-methylpropionitrile) (AIBN) (47.8 mg, 0.04 eq.), and methyl ethyl ketone (5 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of hexanes. The polymer was isolated using a medium porosity ceramic fritted Buchner funnel. The white polymer was redissolved into a minimal amount of methyl ethyl ketone and the precipitation process was repeated one time. Upon final isolation on the Buchner funnel, the polymer was washed 1 time with hexanes. The polymer was dried in vacuo at 80° C. overnight. The polymer was allowed to cool to room temperature under vacuum prior to determining the yield. Yield: 2.24 g (90%). Dissolution rate in 0.26N TMAH: 410 nm/s. SCA: 76.4°, SACA: 87.6°, SRCA: 61.2°, Hyst. 26.4°, Tilt: 23.8°.

EXAMPLE 21

Synthesis of Inventive Material
Poly(2-iPr-EATf-MA) (P11)

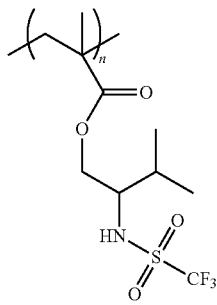

To a 100 mL roundbottom flask, 3-methyl-2-(trifluoromethylsulfonamido)butyl methacrylate (2-iPr-EATf-MA) (2.0 g, 6.6 mmol), 2,2'-azobis(2-methylpropionitrile) (AIBN) (43 mg, 0.04 eq.), and methyl ethyl ketone (6 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of hexanes. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with hexanes. The polymer was dried in vacuo at 80° C. overnight. The polymer was allowed to cool to room temperature under vacuum prior to determining the yield. Yield: 1.47 g (74%). $M_n$: 11080 g/mol. PDI: 2.13. $T_g$: 120° C. Dissolution rate in 0.26N TMAH: 220 nm/s. SCA: 82.2°, SACA: 90.6°, SRCA: 66.0°, Hyst. 24.6°, Tilt: 22.2°.

EXAMPLE 22

Synthesis of Inventive Material
Poly(2-iBu-EATf-MA) (P12)

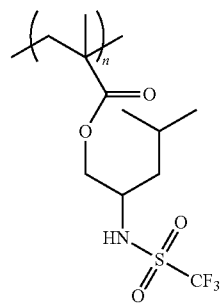

To a 100 mL roundbottom flask, 4-methyl-2-(trifluoromethylsulfonamido)pentyl methacrylate (2-iBu-EATf-MA) (2.5 g, 7.9 mmol), 2,2'-azobis(2-methylpropionitrile) (AIBN) (51.7 mg, 0.04 eq.), and methyl ethyl ketone (7.5 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of hexanes. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with hexanes. The polymer was dried in vacuo at 80° C. overnight. The polymer was allowed to cool to room temperature under vacuum prior to determining the yield. Yield: 1.35 g (54%). $M_n$: 7770 g/mol. PDI: 1.32. $T_g$: 114° C. Dissolution rate in 0.26N TMAH: 118 nm/s. SCA: 87.7°, SACA: 94.0°, SRCA: 70.9°, Hyst.:23.1°, Tilt: 20.1°.

EXAMPLE 23

Synthesis of Inventive Material
Poly(2,2-diMe-EATf-MA) (P13/TC7)

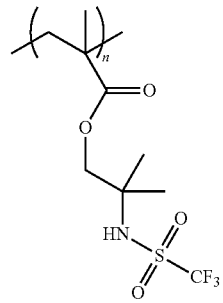

To a 100 mL roundbottom flask, 2-methyl-2-(trifluoromethylsulfonamido)propyl methacrylate (2,2-diMe-EATf-MA) (2.0 g, 6.9 mmol), 2,2'-azobis(2-methylpropionitrile) (AIBN) (45.4 mg, 0.04 eq.), and methyl ethyl ketone (6 g) were added. A reflux condenser and septa were added. The

EXAMPLE 24

Synthesis of Inventive Material
Poly(2,2-diMe-EATf-MA/HFIPMA) (80:20) (TC8)

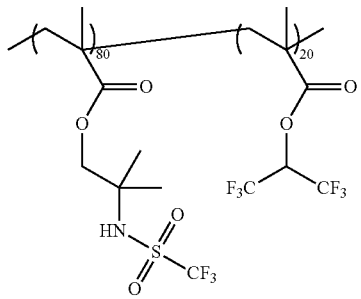

To a 100 mL roundbottom flask, 2-methyl-2-(trifluoromethylsulfonamido)propyl methacrylate (2,2-diMe-EATf-MA) (2.0 g, 6.9 mmol, 0.8 eq.), 1,1,1,3,3,3-hexafluoropropan-2-yl methacrylate (HFIPMA) (0.41 g, 1.7 mmol, 0.2 eq.), 2,2'-azobis(2-methylpropionitrile) (AIBN) (56.8 mg, 0.04 eq.), and methyl ethyl ketone (7.25 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of hexanes. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with hexanes. The polymer was dried in vacuo at 80° C. overnight. The polymer was allowed to cool to room temperature under vacuum prior to determining the yield. The ratio of 2,2-diMe-EATf-MA:HFIPMA incorporated into the polymer was 85:15 as determined by $^{19}$F NMR. The final composition was also 85:15 as determined by inverse-gated $^{13}$C NMR using Cr(acac)$_3$ as a relaxation agent in acetone-d6. Yield: 1.6 g (66%). $M_n$: 9060 g/mol. PDI: 1.95. $T_g$: 118° C. Dissolution rate in 0.26N TMAH: 370 nm/s. SCA: 85.8°, SACA: 90.9°, SRCA: 71.4°, Hyst. 19.5°, Tilt: 17.3°.

EXAMPLE 25

Synthesis of Inventive Material
Poly(2,2-diMe-EATf-MA/HFIPMA) (70:30)
(TC9/A7)

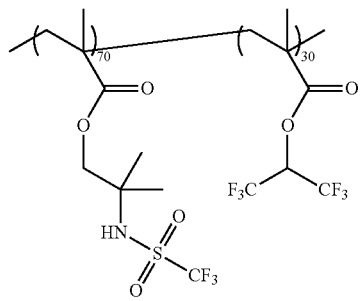

To a 100 mL roundbottom flask, 2-methyl-2-(trifluoromethylsulfonamido)propyl methacrylate (2,2-diMe-EATf-MA) (2.0 g, 6.9 mmol, 0.7 eq.), 1,1,1,3,3,3-hexafluoropropan-2-yl methacrylate (HFIPMA) (0.70 g, 3.0 mmol, 0.3 eq.), 2,2'-azobis(2-methylpropionitrile) (AIBN) (64.9 mg, 0.04 eq.), and methyl ethyl ketone (8 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of hexanes. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was washed 1 time with hexanes. The polymer was dried in vacuo at 80° C. overnight. The polymer was allowed to cool to room temperature under vacuum prior to determining the yield. The ratio of 2,2-diMe-EATf-MA:HFIPMA incorporated into the polymer was 74:26 as determined by $^{19}$F NMR. The final composition was also 74:26 as determined by inverse-gated $^{13}$C NMR using Cr(acac)$_3$ as a relaxation agent in acetone-d6. Yield: 1.9 g (69%). $M_n$: 8620 g/mol. PDI: 1.61. $T_g$: 116° C. Dissolution rate in 0.26N TMAH: 160 nm/s. SCA: 89.4°, SACA: 92.3°, SRCA: 73.0°, Hyst. 19.3°, Tilt: 17.2°.

EXAMPLE 26

Synthesis of Inventive Material Poly(2,2-diMe-EATf-MA/MA-MBTCH-HFA) (70:30) (TC10/A8)

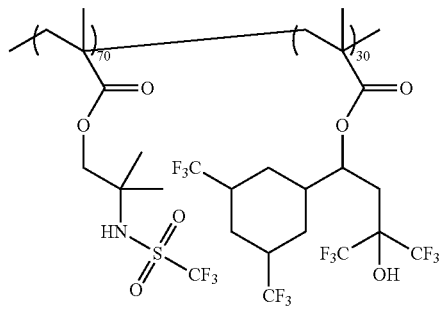

To a 100 mL roundbottom flask, 2-methyl-2-(trifluoromethylsulfonamido)propyl methacrylate (2,2-diMe-EATf-MA) (1.50 g, 5.2 mmol, 0.7 eq.), 1,1,1,3,3,3-hexafluoropropan-2-yl methacrylate (MA-MBTCH-HFA) (1.11 g, 2.2 mmol, 0.3 eq.), 2,2'-azobis(2-methylpropionitrile) (AIBN) (48.7 mg, 0.04 eq.), and methyl ethyl ketone (6 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of hexanes. The polymer was isolated using a medium porosity ceramic fitted Buchner funnel. The white polymer was redissolved into a minimal amount of methyl ethyl ketone and the precipitation process repeated one time. The resultant polymer powder was stirred in Novec™ HFE-7100 for 30 minutes to extract any residual monomer. Upon final isolation on the Buchner funnel, the polymer was washed 1 time with hexanes. The polymer was dried in vacuo at 80° C. overnight. The polymer was allowed to cool to room temperature under vacuum prior to determining the yield. The final composition was 68:32 as determined by inverse-gated $^{13}$C NMR using Cr(acac)$_3$ as a relaxation agent in acetone-d6 and 72:27 by $^{19}$F NMR. Yield: 1.6 g (60%). M$_n$: 15700 g/mol. PDI: 2.3. T$_g$: 133° C. Dissolution rate in 0.26N TMAH: 275 nm/s. SCA: 84.7°, SACA: 91.2°, SRCA: 73.3°, Hyst. 17.9°, Tilt: 16.5°.

EXAMPLE 27

Synthesis of Inventive Material Poly(MA-ACH-HFA/2,2-diMe-EATf-MA) (70:30) (A9)

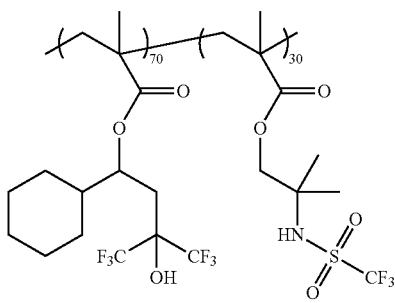

To a 100 mL roundbottom flask, 1-cyclohexyl-4,4,4-trifluoro-3-hydroxy-3-(trifluoromethyl)but-1-yl methacrylate (MA-ACH-HFA) (2.5 g, 6.90 mmol, 0.70 eq.), 2-methyl-2-(trifluoromethylsulfonamido)propyl methacrylate (2,2-diMe-EATf-MA) (0.86 g, 2.96 mmol, 0.30 eq.), 1,1,1-trifluoro-2-trifluoromethyl-2-hydroxy-4-cyclohexyl-but-2-ylmethacrylate (2.5 g, 6.90 mmol, 0.7 eq.), 2,2'-azobis(2-methylpropionitrile) (AIBN) (64.7 mg, 0.04 eq.), and methyl ethyl ketone (7 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the solvent removed in vacuo until a thick liquid was obtained. Novec™ HFE-7100 (80 mL) was added to the flask to precipitate the polymer. The polymer was stirred in the HFE-7100 for 30 minutes and was isolated using a medium porosity ceramic fitted Buchner funnel. The white polymer was resuspended into 80 mL of HFE-7100 and stirred for an additional 15 minutes. After final isolation of the polymer with a Buchner funnel, the polymer was dried in vacuo at 80° C. overnight. The polymer was allowed to cool to room temperature under vacuum prior to determining the yield. The ratio of MA-ACH-HFA:2,2-diMe-EATf-MA:HFIPMA incorporated into the polymer was 67:33 as determined by $^{19}$F NMR. The final composition was 71:29 as determined by inverse-gated $^{13}$C NMR using Cr(acac)$_3$ as a relaxation agent in acetone-d6. Yield: 2.1 g (62%). M$_n$: 8350 g/mol. PDI: 2.65 T$_g$: 103° C. Dissolution rate in 0.26N TMAH: 0.25 nm/s. SCA: 92.6°, SACA: 91.8°, SRCA: 77.7°, Hyst. 14.1°, Tilt: 13.0°.

EXAMPLE 28

Synthesis of Inventive Material Poly(2,2-diMe-EATf-MA/ECPMA) (50:50) (A10)

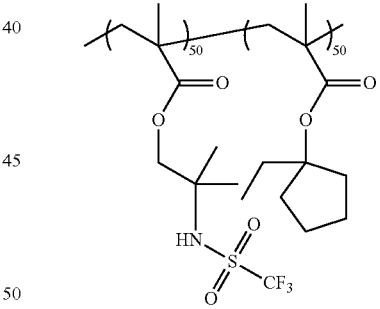

To a 100 mL roundbottom flask, 2-methyl-2-(trifluoromethylsulfonamido)propyl methacrylate (2,2-diMe-EATf-MA) (2.0 g, 6.9 mmol, 0.50 eq.), 1-ethylcyclopentyl methacrylate (ECPMA) (1.3 g, 6.9 mmol, 0.50 eq.), 2,2'-azobis(2-methylpropionitrile) (AIBN) (90.8 mg, 0.04 eq.), and methyl ethyl ketone (7 mL) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of hexanes. The polymer was isolated using a medium porosity ceramic fitted Buchner funnel. The white polymer was redissolved into a minimal amount of methyl ethyl ketone and the precipitation process repeated one time. The resultant polymer powder was stirred in Novec™ HFE-7100 for 30 minutes to extract any residual monomer. Upon final isolation on the Buchner funnel, the polymer was washed 1 time with hexanes. The polymer was dried in vacuo at 80° C. overnight. The polymer was allowed to cool to room temperature under vacuum prior to determining the yield. The final composition was 50.5:49.5 as determined by inverse-gated $^{13}$C NMR using Cr(acac)$_3$ as a relaxation agent in acetone-d6. Yield: 1.6 g (48%). $M_n$: 12050 g/mol. PDI: 1.56. $T_g$: 115° C. Dissolution rate in 0.26N TMAH: swells+6.5 nm/s. SCA: 85.9°, SACA: 88.3°, SRCA: 70.6°, Hyst. 17.7°, Tilt: 16.6°.

EXAMPLE 29

Synthesis of Inventive Mwterial
Poly(2,2-diMe-EATf-MA/ECPMA/HFIPMA)
(30:40:30) (A11)

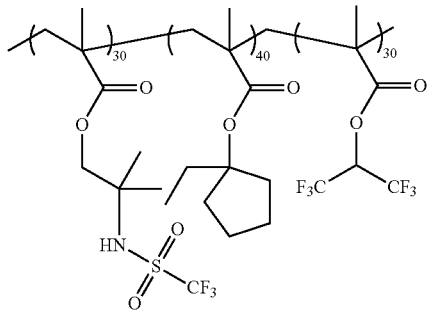

To a 100 mL roundbottom flask, 2-methyl-2-(trifluoromethylsulfonamido)propyl methacrylate (2,2-diMe-EATf-MA) (1.50 g, 5.2 mmol, 0.30 eq.), 1-ethylcyclopentyl methacrylate (ECPMA) (1.26 g, 6.9 mmol, 0.40 eq.), 1,1,1,3,3,3-hexafluoropropan-2-yl methacrylate (HFIPMA) (1.22 g, 5.2 mmol, 0.30 eq.), 2,2'-azobis(2-methylpropionitrile) (AIBN) (114 mg, 0.04 eq.), and methyl ethyl ketone (10 mL) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the polymer precipitated into a 30 fold excess of hexanes. The polymer was isolated using a medium porosity ceramic fritted Buchner funnel. Upon final isolation on the Buchner funnel, the polymer was washed 1 time with hexanes. The polymer was dried in vacuo at 80° C. overnight. The polymer was allowed to cool to room temperature under vacuum prior to determining the yield. The ratio of 2,2-diMe-EATf-MA/ECPMA:HFIPMA incorporated into the polymer was 1:0.81 as determined by $^{19}$F NMR. The final composition was 35:33:32 as determined by inverse-gated $^{13}$C NMR using Cr(acac)$_3$ as a relaxation agent in acetone-d6. Yield: 0.9 g (23%). $M_n$: 11170 g/mol. PDI: 1.43. $T_g$: 105° C. Dissolution rate in 0.26N TMAH: swells +0.1 nm/s. SCA: 93.5°, SACA: 94.0°, SRCA: 74.1°, Hyst. 19.9°, Tilt: 17.6°.

EXAMPLE 30

Synthesis of Inventive Maetrial
Poly(2,2-diMe-EATf-MA/ECPMA/HFIPMA)
(20:50:30) (A12)

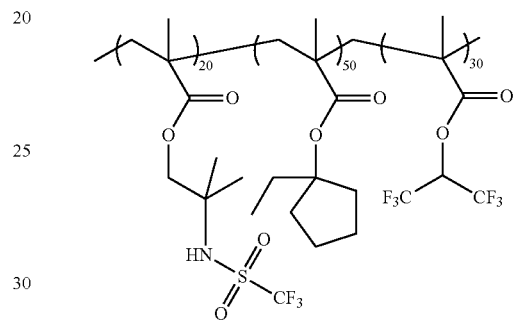

To a 100 mL roundbottom flask, 2-methyl-2-(trifluoromethylsulfonamido)propyl methacrylate (2,2-diMe-EATf-MA) (1.50 g, 5.19 mmol, 0.20 eq.), 1-ethylcyclopentyl methacrylate (ECPMA) (2.36 g, 13.0 mmol, 0.50 eq.), 1,1,1,3,3,3-hexafluoropropan-2-yl methacrylate (HFIPMA) (1.84 g, 7.78 mmol, 0.30 eq.), 2,2'-azobis(2-methylpropionitrile) (AIBN) (85.1 mg, 0.02 eq.), and methyl ethyl ketone (11.5 g) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature and the reaction mixture concentrated to ~60% of the original volume n vacuo. The polymer was precipitated into a 150 mL of Novec™ HFE-7100 (3M Corporation). The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was dried in vacuo at 80° C. overnight. The polymer was allowed to cool to room temperature under vacuum prior to determining the yield. The ratio of 2,2-diMe-EATf-MA:HFIPMA incorporated into the polymer was 1:1.33 as determined by $^{19}$F NMR. The final composition was 17:56:27 as determined by inverse-gated $^{13}$C NMR using Cr(acac)$_3$ as a relaxation agent in acetone-d6. Yield: 1.8 g (32%). $M_n$: 12070 g/mol. PDI: 1.44. $T_g$: 100° C. Dissolution rate in 0.26N TMAH: 0 nm/s. SCA: 94.9°, SACA: 95.9°, SRCA: 78.4°, Hyst. 17.5°, Tilt: 15.6°.

EXAMPLE 31

Synthesis of Inventive Material
Poly(2,2-diMe-EATf-MA/ECPMA/3FMA)
(10:70:20) (A13)

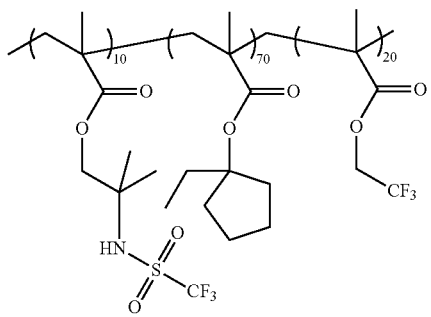

To a 100 mL roundbottom flask, 2-methyl-2-(trifluoromethylsulfonamido)propyl methacrylate (2,2-diMe-EATf-MA) (0.75 g, 2.59 mmol, 0.10 eq.), 1-ethylcyclopentyl methacrylate (ECPMA) (3.31 g, 18.1 mmol, 0.70 eq.), 2,2,2-trifluoroethyl methacrylate (3FMA) (0.87 g, 5.19 mmol, 0.20 eq.), 2,2'-azobis(2-methylpropionitrile) (AIBN) (85 mg, 0.04 eq.), and methyl ethyl ketone (10 mL) were added. A reflux condenser and septa were added. The reaction vessel was subjected to three pump-backfill cycles while stirring vigorously. The reaction flask was placed under nitrogen and transferred to an oil bath to reflux overnight. Upon completion the reaction flask was cooled to room temperature, the solution concentrated in vacuo to around 60%, and the polymer precipitated into 150 mL Novec™ HFE-7100. The polymer was isolated using a medium porosity ceramic fritted Buchner funnel. The white polymer was redissolved into a minimal amount of methyl ethyl ketone and the precipitation process repeated one time. Upon final isolation on the Buchner funnel, the polymer was dried in vacuo at 80° C. overnight. The polymer was allowed to cool to room temperature under vacuum prior to determining the yield. The ratio of 2,2-diMe-EATf-MA:3FMA incorporated into the polymer was 1:2.05 as determined by $^{19}$F NMR. The final composition was 7:76:17 as determined by inverse-gated $^{13}$C NMR using Cr(acac)$_3$ as a relaxation agent in acetone-d6. Yield: 1.8 g (37%). $M_n$: 10650 g/mol. PDI: 1.56. $T_g$: 89° C. Dissolution rate in 0.26N TMAH: 0 nm/s. SCA: 89.6°, SACA: 91.3°, SRCA: 73.4°, Hyst. 17.9°, Tilt: 14.1°.

EXAMPLE 32

Formulation and Lithographic Charactization of Topcoat Materials

A topcoat solution was prepared by dissolving a topcoat polymer in 4-methyl-2-pentanol (5 wt % solids) and filtering through a 0.2 μm PTFE filter.

Figure 5:
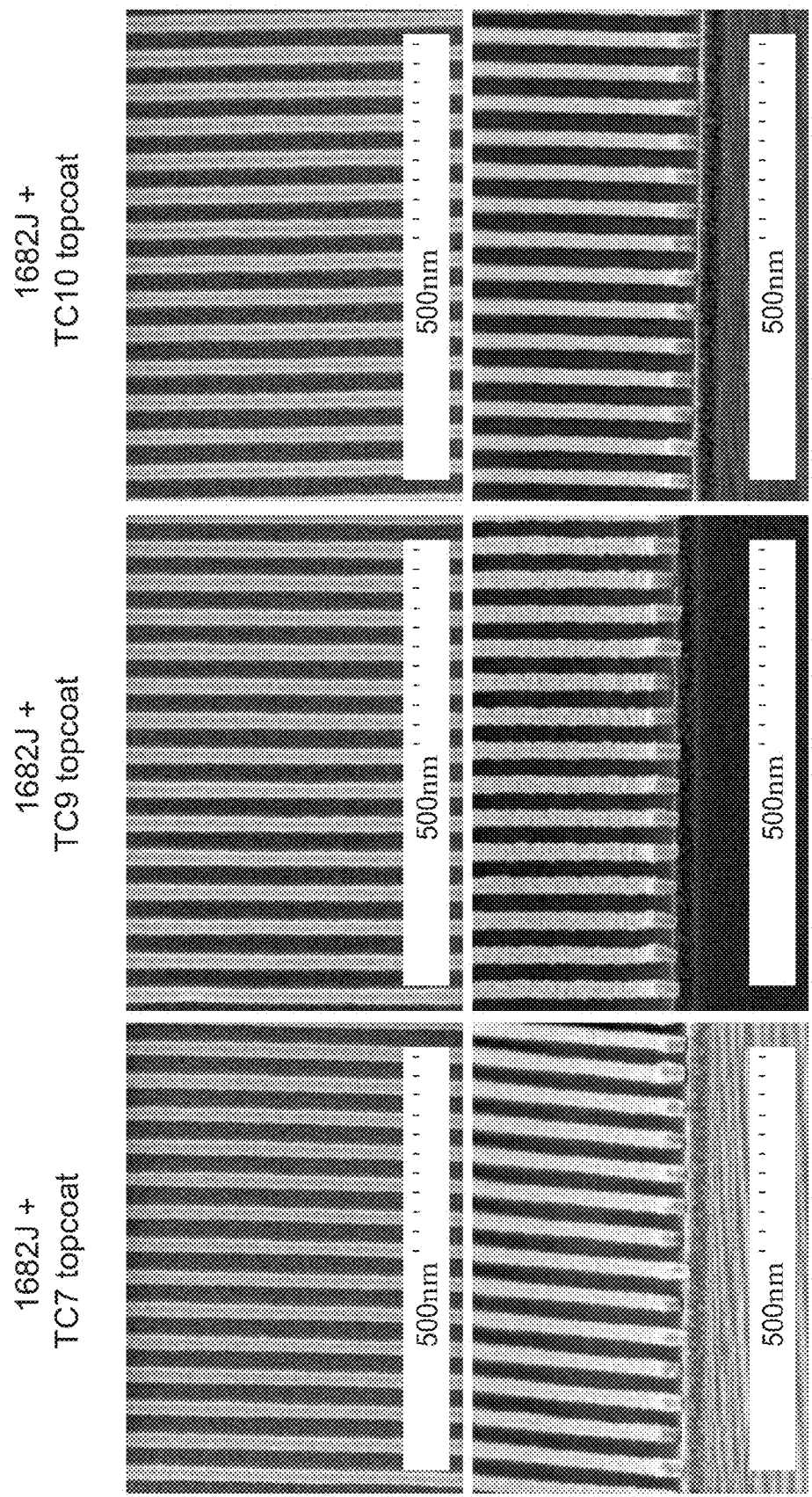
FIG. 5 is a collection of scanning electron micrographs showing the impact of the topcoat materials of the present invention on the patterning performance of JSR AR1682J using 193 nm water immersion interference lithography at 45 nm half-pitch.

For lithographic evaluation, JSR AR1682J photoresist was spun cast at 3400 rpm for 30 seconds on a 5 inch diameter silicon wafer coated with 780 angstroms of an anti-reflective coating (ARC-29A, Brewer Science). After spin casting, the wafer was subjected to a post-application bake at 110° C. for 60 seconds. The topcoat was applied (typically by spin casting at 3400 rpm for 60 seconds) followed by a post-application bake at 90° C. for 60 seconds. Line-space patterns were imaged using a 193 nm immersion interference tool using water as an immersion fluid. After exposure, a post-exposure bake was performed for 60 seconds, typically at 110° C. After the PEB, the photoresist was developed for 60 seconds with 0.26N aqueous tetramethyl-ammonium hydroxide (TMAH) (Optiyield CD, FujiFILM), rinsed with deionized water, and spun dry. The resulting photoresist patterns were then evaluated using a scanning electron microscope as shown in FIG. 5.

TABLE 2

Properties of topcoat and additive polymers.

| Entry | Material | Feed Ratio | Static CA | Adv. CA | Rec. CA | Tilt Angle | Dissolution Rate in 0.26N TMAH [nm/s] |
|---|---|---|---|---|---|---|---|
| Known/Comparative Materials ||||||||
| TC1 | TOK TSP-3A | — | 118° | 114° | 105° | 6.2° | Insoluble |
| TC2 | JSR TCX-014 | — | 77.8° | 86.6° | 55.6° | 30.4° | 645 |
| TC3 | JSR TCX-041 | — | 78.9° | 86.4° | 61.9° | 21.9° | 130 |
| TC4 | Poly(MA-BTHB-OH/HFIPMA) | 90:10 | 86.6° | 88.2° | 71.2° | 16.4 | 22 |
| TC5 | Poly(MA-BTHB-OH/HFIPMA) | 80:20 | 89.6° | 89.4° | 72.2° | 16.4 | 2.4 |
| TC6 | Poly(EATf-MA/HFIPMA) | 70:30 | 83.9° | 92.6° | 61.1° | 28.2° | 400 |
| A1 | Poly(MA-ACH-HFA/EATf-MA) | 70:30 | 91.6° | 91.7° | 74.8° | 15.5° | 0 |
| A2 | Poly(iPrHFAMA/ECPMA/HFIPMA) | 20:50:30 | 95.7° | 98.5° | 77.2° | 18.1° | 0 |
| A3 | Poly(EATf-MA/ECPMA/HFIPMA) | 20:50:30 | 96.4° | 96.4° | 73.6° | 20.0° | 0 |
| A4 | Poly(MA-BTHB-OH/ECPMA/3FMA) | 10:70:20 | 89.7° | 89.6° | 68.6° | 19.4° | 0 |
| A5 | Poly(NBHFAMA/ECPMA/3FMA) | 10:70:20 | 90.1° | 89.6° | 71.5° | 17.8° | 0 |

TABLE 2-continued

Properties of topcoat and additive polymers.

| Entry | Material | Feed Ratio | Static CA | Adv. CA | Rec. CA | Tilt Angle | Dissolution Rate in 0.26N TMAH [nm/s] |
|---|---|---|---|---|---|---|---|
| A6 | Poly(EATf-MA/ECPMA/3FMA) | 10:70:20 | 89.3° | 88.7° | 71.1° | 16.4° | 0 |
| Inventive materials | | | | | | | |
| TC8 | Poly(2,2-diMe-EATf-MA/HFIPMA) | 80:20 | 85.8° | 90.9° | 71.4° | 17.3° | 370 |
| TC9/A7 | Poly(2,2-diMe-EATf-MA/HFIPMA) | 70:30 | 89.4° | 92.3° | 73.0° | 17.2° | 160 |
| TC10/A8 | Poly(2,2-diMe-EATf-MA/MA-MBTCH-HFA) | 70:30 | 84.7° | 91.2° | 73.3° | 16.5° | 275 |
| A9 | Poly(MA-ACH-HFA/2,2-diMe-EATf-MA) | 70:30 | 92.6° | 91.8° | 77.7° | 13.0 | 0.25 |
| A10 | Poly(2,2-diMe-EATf-MA/ECPMA) | 50:50 | 85.9° | 88.3° | 70.6° | 16.6° | +6.5 |
| A11 | Poly(2,2-diMe-EATf-MA/ECPMA/HFIPMA) | 30:40:30 | 93.5° | 94.0° | 74.1° | 17.6° | +0.1 |
| A12 | Poly(2,2-diMe-EATf-MA/ECPMA/HFIPMA) | 20:50:30 | 94.9° | 95.9° | 78.4° | 15.6° | 0 |
| A13 | Poly(2,2-diMe-EATf-MA/ECPMA/3FMA) | 10:70:20 | 89.6° | 91.3° | 73.4° | 14.1° | 0 |

EXAMPLE 33

Formulation and Lithographic Characterization of Topcoat-Free Photoresists

A 5 wt % solution of additive in PGMEA was prepared and filtered through a 0.2 μm PTFE filter. A topcoat-free photoresist solution was prepared by adding a portion of this additive solution to a quantity of JSR AR1682J-10 photoresist such that a 5 wt % additive loading versus the original solids content of the photoresist solution was achieved. The amount of additive polymer according to the embodiments of the present invention added to the photoresist formulation can be from about 0.1% by weight to about 10% by weight of the total solids content of the photoresist formulation (before addition of the additive polymer according to the embodiments of the present invention) in the mixture, although best performance is usually observed with an additive polymer loading of about 1% by weight to about 5% by weight of the total solids in the photoresist formulation (before addition of the additive polymer according to the embodiments of the present invention). The resulting solution was stirred and then filtered through a 0.2 μm PTFE filter.

For contact angle analysis, a film of the topcoat-free photoresist was spun onto a 2 inch diameter silicon wafer coated with 780 angstroms of ARC-29A (Brewer Science). The film was baked at 110° C. for 60 seconds. Water contact angle measurements were then performed using the procedure mentioned previously.

For lithographic evaluation, photoresist was spun cast at 3400 rpm for 30 seconds on a 5 inch diameter silicon wafer coated with 780 angstroms of an anti-reflective coating (ARC-29A, Brewer Science). After spin casting, the wafer was subjected to a post-application bake at 110° C. for 60 seconds. Contrast curves were obtained by imaging a 5×25 dose array consisting of a series of open frame exposures using a 193 nm mini-stepper (Ultratech, 0.6 NA). After exposure, a post-exposure bake (PEB) was performed on a thermal gradient hotplate for 60 seconds. The use of a thermal gradient plate allows separate contrast curves to be obtained for five distinct post-exposure bake temperatures using a single wafer. After the PEB, the photoresist was developed for 60 seconds with 0.26N aqueous tetramethylammonium hydroxide (TMAH) (Optiyield CD, FujiFILM), rinsed with deionized water, and spun dry. Automated film thickness measurements were then obtained using a Nanometrics Nanospec 6100. The contrast curves were used to determine the dose to clear ($E_0$) for subsequent lithographic imaging.

Figure 6:
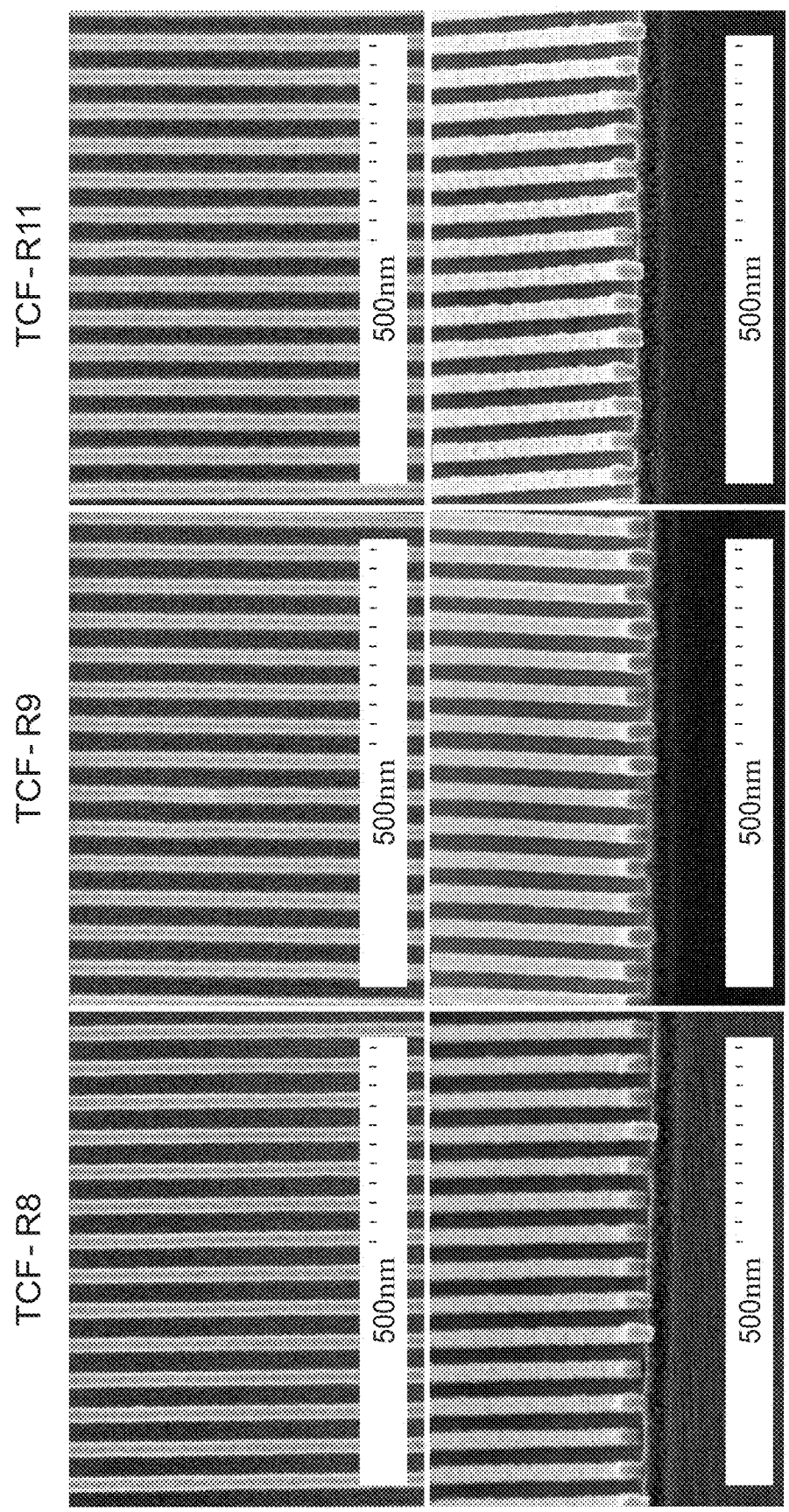
FIG. 6 is a collection of scanning electron micrographs showing the impact of the additive materials of the present invention on the patterning performance of topcoat-free variants of JSR AR1682J using 193 nm water immersion interference lithography at 45 nm half-pitch.
Figure 7:
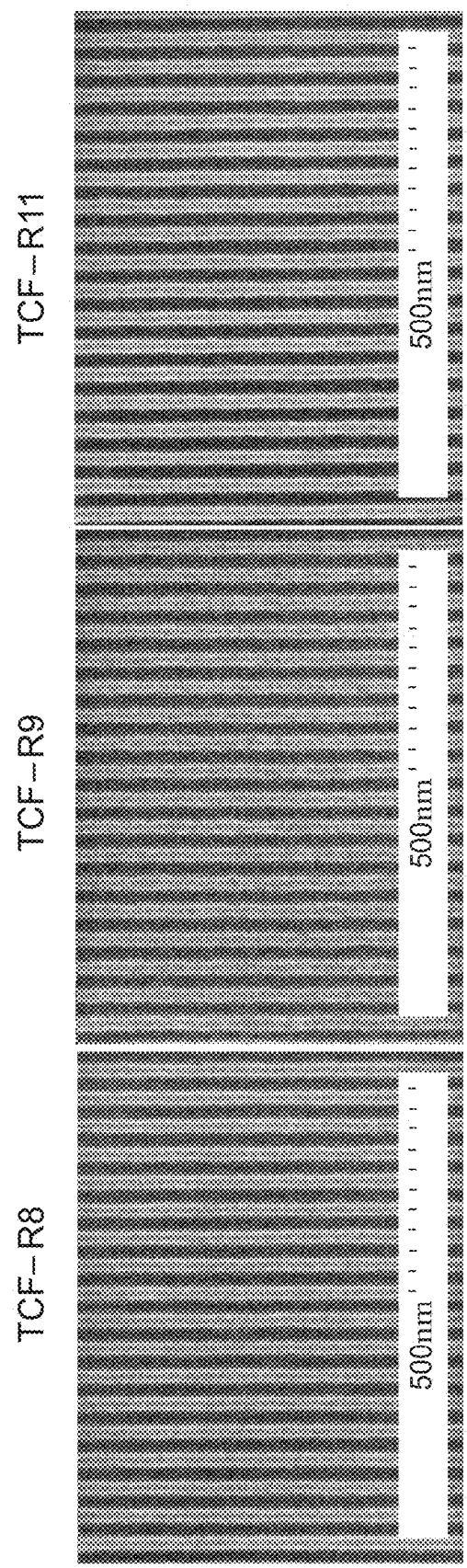
FIG. 7 is a collection of scanning electron micrographs showing the impact of the additive materials of the present invention on the patterning performance of topcoat-free variants of JSR AR1682J using 193 nm water immersion interference lithography at 35 nm half-pitch.

For lithographic imaging, photoresist was spun cast at 3400 rpm for 30 seconds on a 5 inch diameter silicon wafer coated with 780 angstroms of an anti-reflective coating (ARC-29A, Brewer Science). After spin casting, the wafer was subjected to a post-application bake at 110° C. for 60 seconds. Line-space patterns were imaged using a 193 nm immersion interference tool using water as an immersion fluid. After exposure, a post-exposure bake was performed for 60 seconds, typically at 110° C. After the PEB, the photoresist was developed for 60 seconds with 0.26N aqueous tetramethylammonium hydroxide (TMAH) (Optiyield CD, FujiFILM), rinsed with deionized water, and spun dry. The resulting 45 nm half-pitch line-space patterns were then evaluated using a scanning electron microscope as shown in FIG. 6. Higher resolution 35 nm half-pitch line-space patterns are shown in FIG. 7.

TABLE 3

Properties of topcoat-free photoresists.

| Entry | Photoresist | Additive (5 wt %) | SCA | SACA | SRCA | Tilt |
|---|---|---|---|---|---|---|
| Known/Comparative dry photoresists | | | | | | |
| R1 | JSR AR1682J | | 74.1° | 75.9° | 55.0° | 18.7° |
| R2 | JSR AM2073J | | 76.1° | 79.4° | 58.7° | 19.0° |
| Known/Comparative topcoat-free photoresists | | | | | | |
| TCF-R1 | JSR AIM5570JN | | 88.2° | 89.3° | 75.3° | 14.8° |
| TCF-R2 | AR1682J | A1 | 88.9° | 91.9° | 74.2° | 16.4° |
| TCF-R3 | AR1682J | A2 | 95.9° | 96.2° | 73.5° | 20.6° |
| TCF-R4 | AR1682J | A3 | 96.3° | 96.9° | 73.4° | 20.4° |
| TCF-R5 | AR1682J | A4 | 88.8° | 89.2° | 70.8° | 18.0° |
| TCF-R6 | AR1682J | A5 | 88.5° | 88.9° | 71.3° | 16.3° |
| TCF-R7 | AR1682J | A6 | 88.4° | 86.3° | 72.5° | 14.7° |
| Inventive topcoat-free photoresists | | | | | | |
| TCF-R8 | AR1682J | A7 | 84.8° | 92.2° | 70.6° | 19.0° |
| TCF-R9 | AR1682J | A8 | 84.2° | 90.6° | 73.3° | 16.4° |
| TCF-R10 | AR1682J | A9 | 90.3° | 92.6° | 77.2° | 14.0° |
| TCF-R11 | AR1682J | A11 | 95.8° | 96.0° | 76.6° | 17.4° |
| TCF-R12 | AR1682J | A12 | 96.7° | 96.5° | 79.0° | 15.4° |
| TCF-R13 | AR1682J | A13 | 89.0° | 88.2° | 76.2° | 14.2° |

We claim:

1. A composition comprising a homopolymer, the homopolymer comprising a repeat unit having a sulfonamide group and a branched linking group, according to Formula (I)

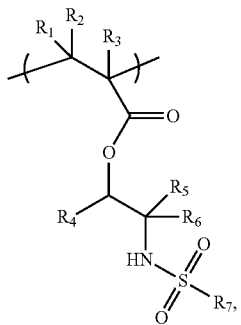

(I)

wherein,
R1 and R2 are independently selected from hydrogen and fluorine;
R3 is selected from the group consisting of hydrogen, fluorine, methyl, and trifluoromethyl;
R4 is hydrogen;
R5 and R6 are methyl; and
R7 is fluorinated C1-C12 alkyl.

2. The composition of claim 1, wherein R7 is selected from trifluoromethyl and perfluorobutyl.

3. A composition comprising a copolymer, the copolymer comprising:

a first repeat unit comprising a sulfonamide group and a branched linking group, according to Formula (I)

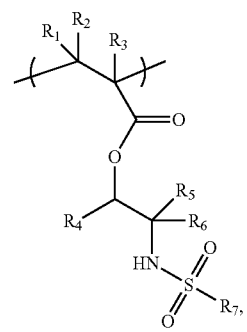

(I)

wherein,
R1 and R2 are independently selected from hydrogen and fluorine;
R3 is selected from the group consisting of hydrogen, fluorine, methyl, and trifluoromethyl;
R4 is hydrogen;
R5 and R6 are methyl; and
R7 is fluorinated C1-C12 alkyl, and a second repeat unit according to the following formula:

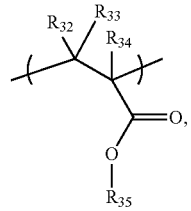

wherein,
R32 and R33 are independently selected from hydrogen and fluorine;
R34 is selected from the group consisting of hydrogen, fluorine, methyl, and trifluoromethyl;
R35 is selected from the group consisting of C1-C12 fluorinated alkyl, C6-C20 fluorinated aryl, and C1-C20 fluorinated ether.

4. The composition of claim 3, wherein R7 is selected from trifluoromethyl and perfluorobutyl.

5. The composition of claim 3, wherein the first repeat unit constitutes at least 5 mole % of the copolymer.

6. The composition of claim 3, wherein the first repeat unit constitutes at least 50 mole % of the copolymer.

7. A composition comprising a copolymer, the copolymer comprising:

a first repeat unit comprising a sulfonamide group and a branched linking group, according to Formula (I)

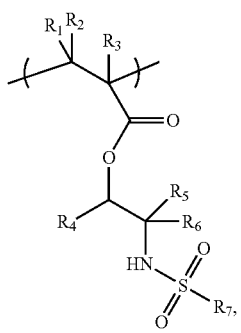

wherein,
R1 and R2 are independently selected from hydrogen and fluorine;
R3 is selected from the group consisting of hydrogen, fluorine, methyl, and trifluoromethyl;
R4 is hydrogen;
R5 and R6 are methyl; and
R7 is fluorinated C1-C12 alkyl, and
a second repeat unit according to the following formula:

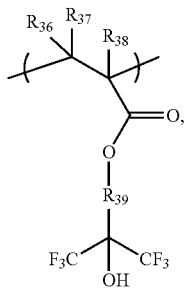

wherein:
R36 and R37 are independently selected from hydrogen and fluorine;
R38 is selected from the group consisting of hydrogen, fluorine, methyl, and trifluoromethyl;
R39 is selected from C1-C12 alkylene and C6-C20 arylene.

8. The composition of claim 7, wherein R7 is selected from trifluoromethyl and perfluorobutyl.

9. The composition of claim 7, wherein the first repeat unit constitutes at least 5 mole % of the copolymer.

10. The composition of claim 7, wherein the first repeat unit constitutes at least 20 mole % of the copolymer.

11. A composition comprising a copolymer, the copolymer comprising:
a first repeat unit comprising a sulfonamide group and a branched linking group, according to Formula (I)

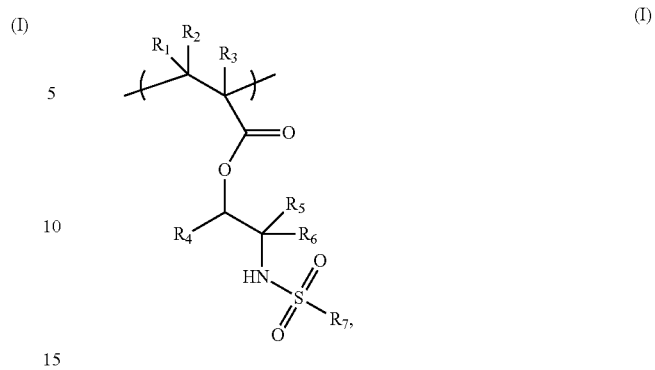

wherein,
R1 and R2 are independently selected from hydrogen and fluorine;
R3 is selected from the group consisting of hydrogen, fluorine, methyl, and trifluoromethyl;
R4 is hydrogen;
R5 and R6 are methyl; and
R7 is fluorinated C1-C12 alkyl, and
a second repeat unit according to the following formula:

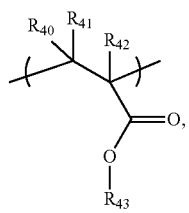

wherein:
R40 and R41 are independently selected from hydrogen and fluorine;
R42 is selected from the group consisting of hydrogen, fluorine, methyl, and trifluoromethyl;
R43 is a C4-C20 tertiary alkyl group.

12. The composition of claim 11, wherein R7 is selected from trifluoromethyl and perfluorobutyl.

13. The composition of claim 11, wherein the first repeat unit constitutes at least 5 mole % of the copolymer.

14. The composition of claim 11, wherein the first repeat unit constitutes at least 30 mole % of the copolymer.

15. A composition comprising a terpolymer, the terpolymer comprising:
a first repeat unit comprising a sulfonamide group and a branched linking group, according to Formula (I)

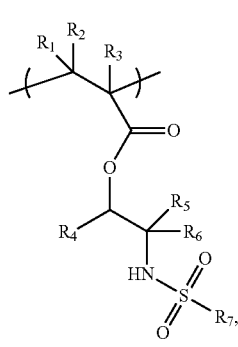

wherein,
R1 and R2 are independently selected from hydrogen and fluorine;
R3 is selected from the group consisting of hydrogen, fluorine, methyl, and trifluoromethyl;
R4 is hydrogen;
R5 and R6 are methyl; and
R7 is fluorinated C1-C12 alkyl,
a second repeat unit according to the following formula:

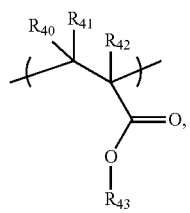

wherein,
R40 and R41 are independently selected from hydrogen and fluorine;
R42 is selected from the group consisting of hydrogen, fluorine, methyl, and trifluoromethyl;
R43 is a C4-C20 tertiary alkyl group, and a third repeat unit according to the following formula:

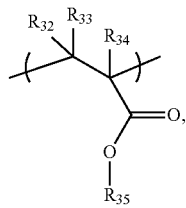

wherein,
R32 and R33 are independently selected from hydrogen and fluorine;
R34 is selected from the group consisting of hydrogen, fluorine, methyl, and trifluoromethyl;
R35 is selected from the group consisting of C1-C12 fluorinated alkyl, C6-C20 fluorinated aryl, and C1-C20 fluorinated ether.

16. The composition of claim 15, wherein R7 is selected from trifluoromethyl and perfluorobutyl.

17. The composition of claim 15, wherein the first repeat unit constitute at least 5 mole % of the terpolymer.

18. The composition of claim 15, wherein the first repeat unit constitutes at least 20 mole % of the terpolymer.

* * * * *